US012805408B2

(12) United States Patent
Lee

(10) Patent No.: US 12,805,408 B2
(45) Date of Patent: Nov. 17, 2026

(54) SEMICONDUCTOR DEVICE AND SEMICONDUCTOR PACKAGE INCLUDING THE SAME

(71) Applicant: Samsung Electronics Co., Ltd., Suwon-si (KR)

(72) Inventor: Doheon Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 322 days.

(21) Appl. No.: 18/663,494

(22) Filed: May 14, 2024

(65) Prior Publication Data

US 2025/0105190 A1 Mar. 27, 2025

(30) Foreign Application Priority Data

Sep. 26, 2023 (KR) ........................ 10-2023-0129558

(51) Int. Cl.
*H10W 90/00* (2026.01)
*H10W 20/20* (2026.01)
(Continued)

(52) U.S. Cl.
CPC ........... *H10W 90/00* (2026.01); *H10W 20/20* (2026.01); *H10W 74/117* (2026.01);
(Continued)

(58) Field of Classification Search
CPC ... H10W 90/00; H10W 20/20; H10W 74/117; H10W 72/221; H10W 72/227; H10W 72/267; H10W 74/10; H10W 90/297; H10W 90/722; H10W 90/724; H10W 72/20; H10W 90/26; H10W 90/291; H10W 20/435; H10W 70/614; H10W 70/635; H10W 70/65; H10W 72/07252; H10W 72/07253; H10W 72/248; H10W 72/281;
(Continued)

(56) References Cited

U.S. PATENT DOCUMENTS 8,362,610 B2 1/2013 Fukuda
9,356,009 B2 * 5/2016 Chandolu ........... H10W 20/023
(Continued)

FOREIGN PATENT DOCUMENTS

KR 10-1362396 B1 2/2014

*Primary Examiner* — J. E. Schoenholtz
(74) *Attorney, Agent, or Firm* — HARNESS, DICKEY & PIERCE, P.L.C.

(57) ABSTRACT

A semiconductor package includes a first semiconductor chip on a package substrate, and a molding film on the package substrate and covering a side surface of the first semiconductor chip, wherein the first semiconductor chip includes a first semiconductor substrate, first signal pillars on a lower surface of a first signal region of the first semiconductor substrate and having a first signal pitch, first dummy pillars on a lower surface of a first dummy region of the first semiconductor substrate and having a first dummy pitch greater than the first signal pitch, second dummy pillars disposed on a lower surface of a second dummy region of the first semiconductor substrate and having a second dummy pitch greater than the first dummy pitch, and a dummy agglomerate solder connected to lower surfaces of adjacent first dummy pillars among the first dummy pillars.

20 Claims, 25 Drawing Sheets

(51) Int. Cl.
*H10W 72/20* (2026.01)
*H10W 74/10* (2026.01)
*H10W 90/20* (2026.01)

(52) U.S. Cl.
CPC ........ *H10W 72/221* (2026.01); *H10W 72/227* (2026.01); *H10W 72/267* (2026.01); *H10W 74/10* (2026.01); *H10W 90/297* (2026.01); *H10W 90/722* (2026.01); *H10W 90/724* (2026.01)

(58) Field of Classification Search
CPC ............. H10W 72/823; H10W 74/111; H10W 74/141; H10W 90/701; H10B 80/00
See application file for complete search history.

(56) References Cited

U.S. PATENT DOCUMENTS

| | | | | |
|---|---|---|---|---|
| 9,543,276 | B2 | 1/2017 | Jee et al. | |
| 10,431,547 | B2 | 10/2019 | Nam et al. | |
| 11,114,415 | B2 * | 9/2021 | Zhou | H10W 20/20 |
| 11,257,794 | B2 | 2/2022 | Song et al. | |
| 2010/0171208 | A1 * | 7/2010 | Fujii | H10W 72/20 257/737 |
| 2022/0149011 | A1 * | 5/2022 | Chandolu | H10W 20/023 |
| 2022/0293566 | A1 | 9/2022 | Park et al. | |
| 2022/0392859 | A1 | 12/2022 | Ma | |
| 2022/0406755 | A1 | 12/2022 | Hong et al. | |

* cited by examiner

SEMICONDUCTOR DEVICE AND SEMICONDUCTOR PACKAGE INCLUDING THE SAME

CROSS-REFERENCE TO RELATED APPLICATION

This application is based on and claims priority under 35 U.S.C. § 119 to Korean Patent Application No. 10-2023-0129558, filed on Sep. 26, 2023, in the Korean Intellectual Property Office, the disclosure of which is incorporated by reference herein in its entirety.

BACKGROUND

The inventive concepts relate to semiconductor devices and semiconductor packages, and more particularly, to bumps of semiconductor devices.

Semiconductor packages are provided by fabricating integrated circuit chips into a form suitable for use in electronic products. Generally, in semiconductor packages, semiconductor chips are mounted on a printed circuit board, and bonding wires or bumps establish electrical connections therebetween. With the development of the electronics industry, various research has been conducted to improve the reliability and high integration of semiconductor packages.

SUMMARY

The inventive concepts provide semiconductor packages having improved performance and improved reliability.

The inventive concepts also provide semiconductor devices having improved performance and improved reliability.

According to an aspect of the inventive concepts, there is provided a semiconductor package a package substrate; a first semiconductor chip on the package substrate; and a molding film on the package substrate and covering a side surface of the first semiconductor chip, wherein the first semiconductor chip includes, a first semiconductor substrate, first signal pillars on a lower surface of a first signal region of the first semiconductor substrate and the first signal pillars having a first signal pitch, first dummy pillars on a lower surface of a first dummy region of the first semiconductor substrate and the first dummy pillars having a first dummy pitch greater than the first signal pitch, second dummy pillars on a lower surface of a second dummy region of the first semiconductor substrate and the second dummy pillars having a second dummy pitch greater than the first dummy pitch, and a dummy agglomerate solder connected to lower surfaces of adjacent first dummy pillars among the first dummy pillars, wherein the molding film extends between the package substrate and the first semiconductor chip and covers sidewalls of the first signal pillars and sidewalls of the second dummy pillars, and a first void defined by the molding film, the first void between the adjacent first dummy pillars, and at least a portion of the dummy agglomerate solder is provided in the first void.

According to another aspect of the inventive concepts, there is provided a semiconductor device including a semiconductor substrate; signal bumps on a signal region of the semiconductor substrate; first dummy bumps on a first dummy region of the semiconductor substrate and having a first dummy pitch greater than a signal pitch of the signal bumps; and second dummy bumps on second dummy regions of the semiconductor substrate and having a second dummy pitch greater than the signal pitch of the signal bumps, wherein the second dummy pitch is different from the first dummy pitch, the signal region of the semiconductor substrate is spaced apart from a first side surface and a second side surface of the semiconductor substrate and the signal region extends in a first direction in a plan view, the first dummy region of the semiconductor substrate is between the signal region and the first side surface of the semiconductor substrate, the second dummy regions of the semiconductor substrate are between the signal region and the second side surface of the semiconductor substrate, and the second side surface of the semiconductor substrate is opposite to the first side surface of the semiconductor substrate, a passage region on the semiconductor substrate without any bumps on the semiconductor substrate in the passage region, the passage region of the semiconductor substrate extends from the second side surface of the semiconductor substrate to the signal region of the semiconductor substrate in a plan view, and a width of the passage region of the semiconductor substrate in the first direction is at least three times of the second dummy pitch.

According to another aspect of the inventive concepts, there is provided a semiconductor package including a package substrate including connection substrate pads and dummy substrate pads; solder ball terminals on a lower surface of the package substrate, connected to the connection substrate pads, and insulated from the dummy substrate pads; a first semiconductor chip on an upper surface of the package substrate; a second semiconductor chip on an upper surface of the first semiconductor chip; and a molding film on the package substrate and covering a sidewall of the first semiconductor chip and a sidewall of the second semiconductor chip, wherein the first semiconductor chip includes, a first semiconductor substrate; first through-vias passing through the first semiconductor substrate; first upper connection pads on the first semiconductor substrate and connected to the first through-vias; and first upper dummy pads laterally spaced apart from the first upper connection pads and insulated from the first through-vias, wherein the second semiconductor chip includes, a second semiconductor substrate; first signal pillars on a lower surface of a first signal region of the second semiconductor substrate and having a first signal pitch; second signal pillars on lower surfaces of second signal regions of the second semiconductor substrate and having a second signal pitch greater than the first signal pitch; first dummy pillars on a lower surface of a first dummy region of the second semiconductor substrate and having a first dummy pitch greater than the first signal pitch and the second signal pitch; second dummy pillars on a lower surface of a second dummy region of the second semiconductor substrate and having a second dummy pitch greater than the first signal pitch and the second signal pitch; and voltage pillars on a lower surface of a corner region of the second semiconductor substrate and having a voltage pitch greater than the first signal pitch and the second signal pitch, wherein the second dummy pitch is greater than the first dummy pitch, the first signal region extends in a direction parallel to a first side surface and a second side surface of the second semiconductor substrate in a plan view, and the first side surface and the second side surface of the second semiconductor substrate are longer than a third side surface and a fourth side surface of the second semiconductor substrate, the second signal regions are between the first signal region and the third side surface of the second semiconductor substrate and between the first signal region and the fourth side surface of the second semiconductor substrate, the first signal pillars, the second signal pillars, and the voltage pillars are electrically connected to the first upper connection pads, the first dummy pillars and the second dummy pillars are connected to the first upper dummy pads, the molding film extends between the first semiconductor chip and the second semiconductor chip and covers sidewalls of the first signal pillars, sidewalls of the second signal pillars, sidewalls of the voltage pillars, and sidewalls of the second dummy pillars, the second semiconductor chip includes a dummy agglomerate solder on lower surfaces of adjacent first dummy pillars among the first dummy pillars, and the dummy agglomerate solder is on upper surfaces of at least two of the first upper dummy pads.

BRIEF DESCRIPTION OF THE DRAWINGS

Example embodiments will be more clearly understood from the following detailed description taken in conjunction with the accompanying drawings in which.

DETAILED DESCRIPTION

Figure 1A:
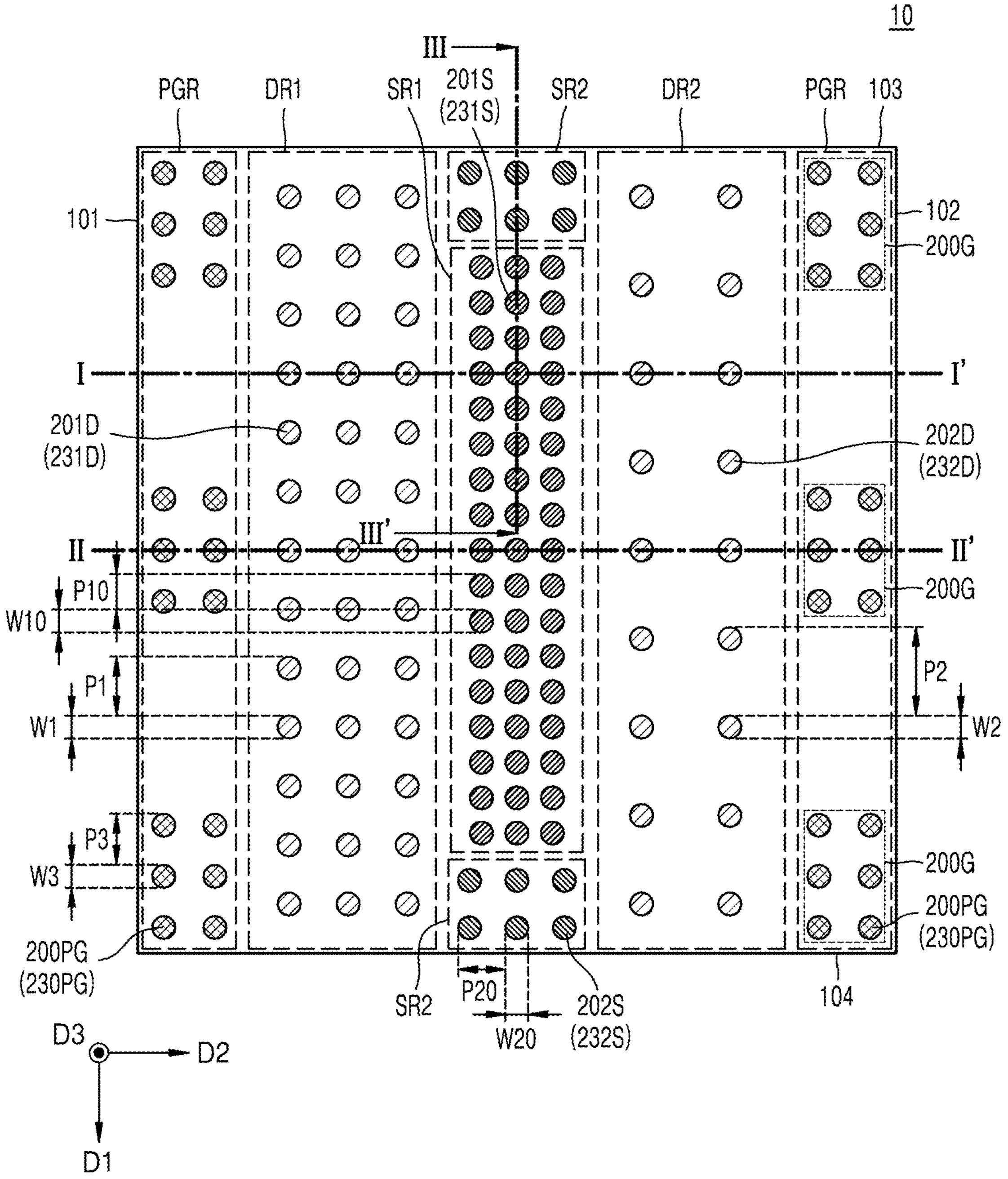
FIG. 1A is a plan view showing a semiconductor device according to example embodiments.

In this specification, the same reference numerals may refer to the same elements throughout. A semiconductor device, a semiconductor package, and a method of manufacturing the semiconductor package according to the inventive concept are described below.

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values or shapes should be construed as including a manufacturing or operational tolerance (e.g., ±10%) around the stated numerical values or shapes. When ranges are specified, the range includes all values therebetween such as increments of 0.1%.

Figure 1B:
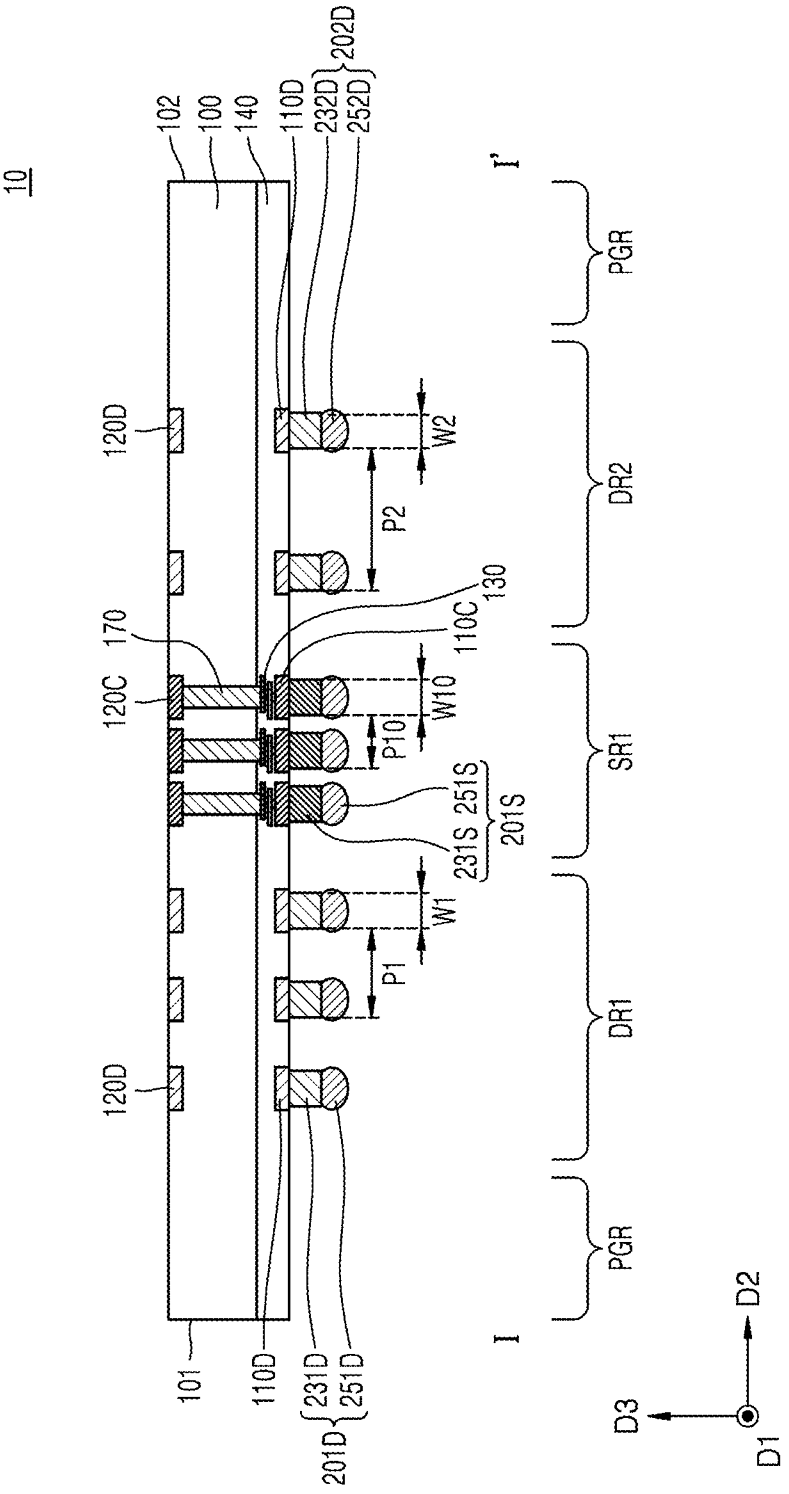
FIG. 1B is a cross-section of the semiconductor device taken along line I-I' of FIG. 1A.
Figure 1C:
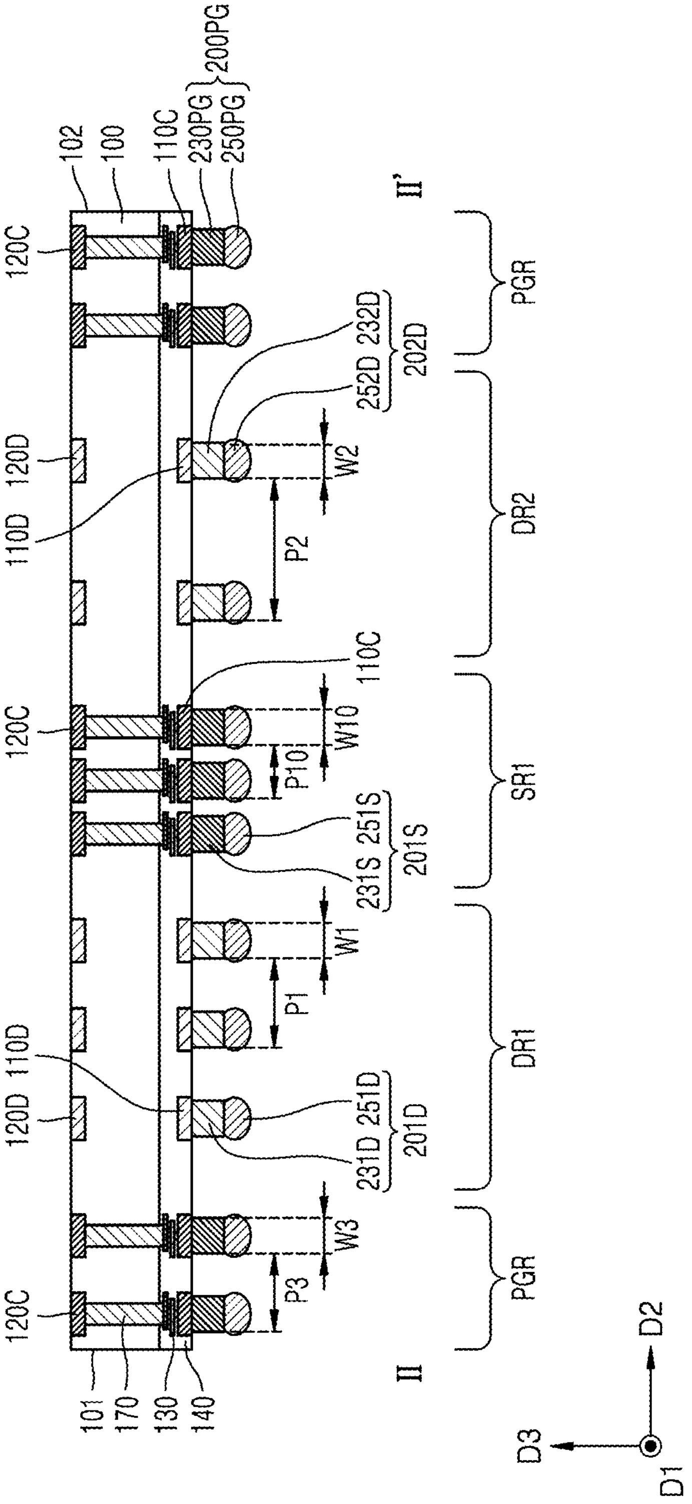
FIG. 1C is a cross-section of the semiconductor device taken along line II-II' of FIG. 1A.
Figure 1D:
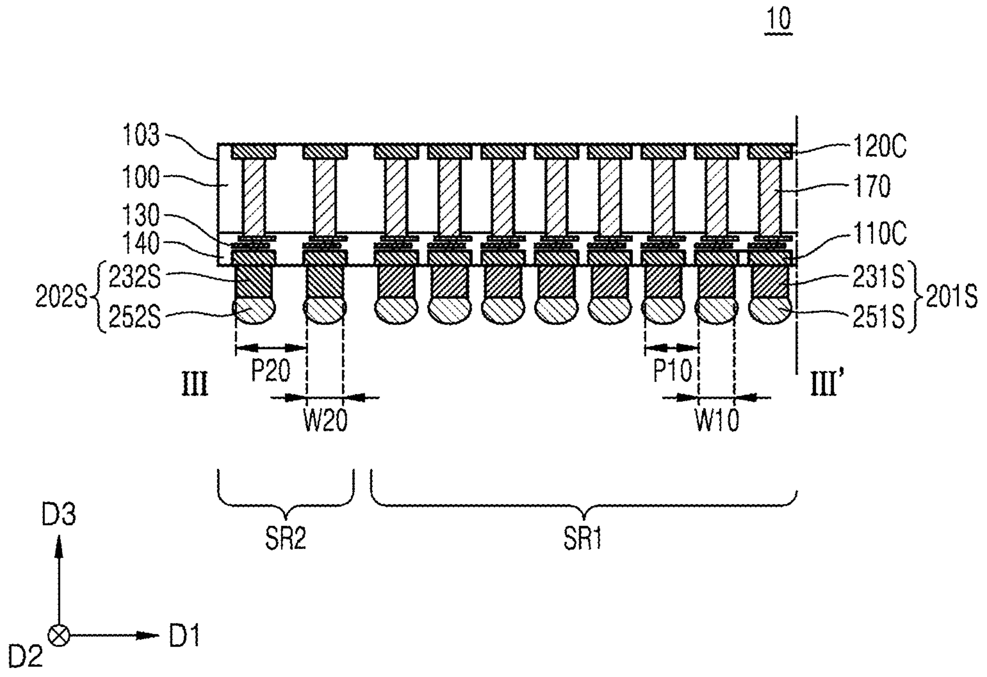
FIG. 1D is a cross-section of the semiconductor device taken along line III-III' of FIG. 1A.

FIG. 1A is a plan view showing a semiconductor device 10 according to some example embodiments. FIG. 1B is a cross-section of the semiconductor device 10 taken along line I-I' of FIG. 1A. FIG. 1C is a cross-section of the semiconductor device 10 taken along line II-II' of FIG. 1A. FIG. 1D is a cross-section of the semiconductor device 10 taken along line III-III' of FIG. 1A.

Referring to FIGS. 1A to 1D, the semiconductor device 10 may include a semiconductor chip. For example, the semiconductor device 10 may include a memory chip. In another example, the semiconductor device 10 may include a logic chip or a buffer chip.

The semiconductor device 10 may include a semiconductor substrate 100. The semiconductor substrate 100 may have a first side surface 101, a second side surface 102, a third side surface 103, and a fourth side surface 104. The first side surface 101 and the second side surface 102 of the semiconductor substrate 100 may face each other. The first side surface 101 and the second side surface 102 of the semiconductor substrate 100 may correspond to long sides of the semiconductor substrate 100. The third side surface 103 and the fourth side surface 104 of the semiconductor substrate 100 may be parallel to a second direction D2 and face each other. The third side surface 103 and the fourth side surface 104 of the semiconductor substrate 100 may be adjacent to the first side surface 101. The third side surface 103 and the fourth side surface 104 of the semiconductor substrate 100 may be shorter than the first side surface 101 and the second side surface 102. The third side surface 103 and the fourth side surface 104 of the semiconductor substrate 100 may correspond to short sides of the semiconductor substrate 100.

In a plan view, the semiconductor substrate 100 may include a first signal region SR1, second signal regions SR2, a first dummy region DR1, a second dummy region DR2, and voltage supply regions PGR. The first signal region SR1 of the semiconductor substrate 100 may extend in a direction parallel to a first direction D1. The first signal region SR1 of the semiconductor substrate 100 may be spaced apart from the first side surface 101 and the second side surface 102 of the semiconductor substrate 100. The first direction D1 may be parallel to the upper surface of the semiconductor substrate 100 and parallel to the first side surface 101 of the semiconductor substrate 100. The second direction D2 may be parallel to the upper surface of the semiconductor substrate 100 and intersect with the first direction D1. A third direction D3 may be substantially perpendicular to the upper surface of the semiconductor substrate 100. The third direction D3 may be a vertical direction.

The second signal regions SR2 of the semiconductor substrate 100 may include a region between the first signal region SR1 and the third side surface 103 of the semiconductor substrate 100 and a region between the first signal region SR1 and the fourth side surface 104 of the semiconductor substrate 100.

The first dummy region DR1 of the semiconductor substrate 100 may be provided between the first side surface 101 of the semiconductor substrate 100 and the first signal region SR1. The second dummy region DR2 of the semiconductor substrate 100 may be provided between the second side surface 102 of the semiconductor substrate 100 and the first signal region SR1.

The voltage supply regions PGR of the semiconductor substrate 100 may be arranged between the first dummy region DR1 and the first side surface 101 of the semiconductor substrate 100 and between the second dummy region DR2 and the second side surface 102 of the semiconductor substrate 100. The voltage supply regions PGR of the semiconductor substrate 100 may include corner regions of the semiconductor substrate 100. The corner regions of the semiconductor substrate 100 may include corner portions. Any two side surfaces of the first to fourth side surfaces 101, 102, 103, and 104 may meet each other at the corner portion.

The semiconductor substrate 100 may include a semiconductor material, such as silicon, germanium, and silicon-germanium.

As shown in FIGS. 1B to 1D, the semiconductor device 10 may include integrated circuits (not shown) and a circuit layer. For example, the integrated circuits may be provided on the lower surface of the semiconductor substrate 100. The circuit layer may be provided on the lower surface of the semiconductor substrate 100. The circuit layer may include wiring patterns 130 and an insulating layer 140. The insulating layer 140 may be provided on the lower surface of the semiconductor substrate 100 and cover the integrated circuits. The insulating layer 140 may include multi layers. The wiring patterns 130 may be provided in the insulating layer 140 and electrically connected to the integrated circuits. In this specification, electrically connecting a component to a semiconductor chip may indicate that the component is electrically connected to the integrated circuits of the semiconductor chip via the wiring patterns 130. The fact that two components are electrically connected/coupled to each other includes directly connecting/coupling the components to each other or indirectly connecting/coupling the components to each other via another conductive component. In the drawings except for FIGS. 1B, 1C, and 1D, the insulating layer 140 is omitted for simplicity. However, the inventive concepts are not limited thereto.

The semiconductor device 10 may include lower connection pads 110C, lower dummy pads 110D, upper connection pads 120C, upper dummy pads 120D, and through-vias 170. The lower connection pads 110C may be arranged on the lower surface of the first signal region SR1 and the lower surface of the second signal region SR2 of the semiconductor substrate 100. The lower connection pads 110C may be electrically connected to at least one of the through-vias 170 and the integrated circuits via the wiring patterns 130. The lower connection pads 110C may include copper, titanium, and/or a metal material, such as an alloy of copper and titanium.

The lower dummy pads 110D may be provided on the lower surface of the first dummy region DR1 and the lower surface of the second dummy region DR2 of the semiconductor substrate 100. The lower dummy pads 110D may be laterally spaced apart from the lower connection pads 110C and electrically insulated from the lower connection pads 110C. The lower dummy pads 110D may be spaced apart from the through-vias 170 and the wiring patterns 130. The lower dummy pads 110D may be insulated from the integrated circuits, the through-vias 170, and the wiring patterns 130 of the semiconductor device 10. For example, the lower dummy pads 110D may include the same metal material as the lower connection pads 110C. The lower dummy pads 110D may include copper, titanium, and/or a metal material, such as an alloy of copper and titanium.

The through-vias 170 may be provided in the semiconductor substrate 100 and pass through the upper and lower surfaces of the semiconductor substrate 100. The through-vias 170 may further pass through a portion of the insulating layer 140. The through-vias 170 may be electrically connected to the lower connection pads 110C or the integrated circuits via the wiring patterns 130. The through-vias 170 may include copper, titanium, and/or a metal material, such as an alloy of copper and titanium.

The upper connection pads 120C may be provided on the upper surface of the semiconductor substrate 100 and spaced apart from each other. The upper connection pads 120C may be arranged on the upper surface of the first signal region SR1 and the upper surface of the second signal region SR2 of the semiconductor substrate 100. The upper connection pads 120C may be further provided on the upper surface of the voltage supply regions PGR of the semiconductor substrate 100. The upper connection pads 120C may be arranged on the upper surfaces of the through-vias 170 and electrically connected to the through-vias 170. The upper connection pads 120C may be electrically connected to the integrated circuits or the lower connection pads 110C via the through-vias 170. The upper connection pads 120C may include copper, titanium, and/or a metal material, such as an alloy of copper and titanium.

The upper dummy pads 120D may be provided on the upper surface of the semiconductor substrate 100. For example, the upper dummy pads 120D may be provided on the upper surface of the first dummy region DR1 and the upper surface of the second dummy region DR2 of the semiconductor substrate 100. For example, the upper dummy pads 120D may overlap the lower dummy pads 110D in a plan view. The upper dummy pads 120D may be spaced apart from the through-vias 170 and electrically insulated therefrom. The upper dummy pads 120D may be laterally spaced apart from the upper connection pads 120C and electrically insulated therefrom. The upper dummy pads 120D may be insulated from the integrated circuits and the wiring patterns 130 of the semiconductor device 10. The upper dummy pads 120D may include the same metal material as the upper connection pads 120C. The upper dummy pads 120D may include copper, titanium, and/or a metal material, such as an alloy of copper and titanium.

The semiconductor device 10 may include first signal bumps 201S, second signal bumps 202S, first dummy bumps 201D, second dummy bumps 202D, and voltage bumps 200PG. The first signal bumps 201S may be provided on the lower surface of the first signal region SR1 of the semiconductor substrate 100. The first signal bumps 201S may be provided on the lower surfaces of the lower connection pads 110C and connected to the lower connection pads 110C. Accordingly, the first signal bumps 201S may be connected to the integrated circuits and/or the through-vias 170 via the lower connection pads 110C and the wiring patterns 130. Connecting a component to the through-vias 170 and/or the integrated circuits may indicate that the component is electrically connected to at least one of the through-vias 170 and the integrated circuit. As shown in FIG. 1A, in a plan view, the first signal bumps 201S may be arranged in a column direction and a row direction to thereby form an array. The column direction may be parallel to the first direction D1 and the row direction may be parallel to the second direction D2.

The first signal bumps 201S may have a first signal pitch P10. The first signal pitch P10 may be relatively small. For example, the first signal pitch P10 may be about 15 μm to about 45 μm. The first signal bumps 201S may be arranged highly densely. The first signal pitch P10 is 45 μm or less, and thus, the number of input/output terminals of the semiconductor device 10 may be increased. Accordingly, the semiconductor device 10 may be highly integrated and have high performance. The first signal pitch P10 is 45 μm or less, and thus, the semiconductor device 10 may be reduced in size. Unless otherwise stated herein, a relationship in the sizes of pitches between components may correspond to a relationship in the sizes of pitches between the components in the same direction. The first signal pitch P10 is 15 μm or more, and thus, an electrical short circuit between the first signal bumps 201S may be prevented or reduced in likelihood.

Each of the first signal bumps 201S may include a first signal pillar 231S and a first signal solder pattern 251S. The first signal pillar 231S may be disposed on the lower surface of the corresponding one of the lower connection pads 110C. The first signal solder pattern 251S may be disposed on the lower surface of the first signal pillar 231S. That is, the first signal pillar 231S may be located between the lower connection pad 110C corresponding thereto and the first signal solder pattern 251S. The first signal solder pattern 251S may be formed by attaching a solder ball to the lower surface of the first signal pillar 231S. The first signal solder pattern 251S may include a metal material that is different from that of the first signal pillar 231S. The first signal solder pattern 251S may include a solder material. The solder material may include, for example, tin, bismuth, lead, silver, or an alloy thereof. The first signal pillar 231S may include a metal material, such as copper.

The semiconductor device 10 may include a plurality of first signal pillars 231S and a plurality of first signal solder patterns 251S. The first signal pitch P10 may correspond to the pitch between the plurality of first signal pillars 231S.

The first dummy bumps 201D may be provided on the lower surface of the first dummy region DR1 of the semiconductor substrate 100. The first dummy bumps 201D may have a first dummy pitch P1. The first dummy pitch P1 may be greater than the first signal pitch P10. For example, the first dummy pitch P1 may be about 55 μm to about 80 μm. The first dummy bumps 201D may be arranged more densely than the second dummy bumps 202D, which are described below. For example, as shown in FIG. 1A, the first dummy bumps 201D may be arranged in a row direction and a column direction to thereby form an array in a plan view. However, the arrangement of the first dummy bumps 201D in a plan view is not limited thereto, and the first dummy bumps 201D may be arranged in various patterns, such as a zigzag arrangement or a honeycomb arrangement.

As shown in FIGS. 1B to 1D, the first dummy bumps 201D may be provided on the lower surfaces of the lower dummy pads 110D. The first dummy bumps 201D may be spaced apart from the through-vias 170 and the integrated circuits and electrically insulated from the through-vias 170 and the integrated circuits. The first dummy bumps 201D may be laterally spaced apart from the first signal bumps 201S and insulated from the first signal bumps 201S. The first dummy bumps 201D may function as support bumps and heat dissipation bumps.

Each of the first dummy bumps 201D may include a first dummy pillar 231D and a first dummy solder pattern 251D. The first dummy pillar 231D may be disposed on the lower surface of the corresponding one of the lower dummy pads 110D. For example, the first dummy pillar 231D may be located between the lower dummy pad 110D corresponding thereto and the first dummy solder pattern 251D. The first dummy pillar 231D may include, for example, copper. The first dummy solder pattern 251D may be formed by attaching a solder ball to the lower surface of the first dummy pillar 231D. The first dummy solder pattern 251D may include a metal material that is different from that of the first dummy pillar 231D. The first dummy solder pattern 251D may include a solder material.

The semiconductor device 10 may include a plurality of first dummy pillars 231D and a plurality of first dummy solder patterns 251D. The first dummy pitch P1 may correspond to the pitch between the plurality of first dummy pillars 231D.

The second dummy bumps 202D may be provided on the lower surface of the second dummy region DR2 of the semiconductor substrate 100. The second dummy bumps 202D may have a second dummy pitch P2. The second dummy pitch P2 may be relatively large. The second dummy pitch P2 may be greater than the first signal pitch P10. The second dummy pitch P2 may be different from the first dummy pitch P1. The second dummy pitch P2 may be greater than the first dummy pitch P1. For example, the second dummy pitch P2 may be 55 μm or more. The second dummy bumps 202D may be arranged more sparsely than the first dummy bumps 201D and the first signal bumps 201S. The total planar area of the second dummy bumps 202D per unit area of the second dummy region DR2 of the semiconductor substrate 100 may be less than the total planar area of the first dummy bumps 201D per unit area of the first dummy region DR1 of the semiconductor substrate 100. For example, as shown in FIG. 1A, the second dummy bumps 202D may be arranged in a row direction and a column direction to thereby form an array in a plan view. The arrangement of the second dummy bumps 202D in a plan view is not limited to that shown in FIG. 1A, and the second dummy bumps 202D may be arranged in various patterns.

As shown in FIGS. 1B and 1C, the second dummy bumps 202D may be provided on the lower surfaces of the lower dummy pads 110D. The second dummy bumps 202D may be spaced apart from the through-vias 170, the wiring patterns 130, and the integrated circuits and electrically insulated from the through-vias 170, the wiring patterns 130, and the integrated circuits. The second dummy bumps 202D may be laterally spaced apart from the first signal bumps 201S and insulated from the first signal bumps 201S. The second dummy bumps 202D may function as support bumps and heat dissipation bumps.

Each of the second dummy bumps 202D may include a second dummy pillar 232D and a second dummy solder pattern 252D. The second dummy pillar 232D may be located between the lower dummy pad 110D corresponding thereto and the second dummy solder pattern 252D. The second dummy pillar 232D may include, for example, copper. The second dummy solder pattern 252D may be formed by attaching a solder ball to the lower surface of the second dummy pillar 232D. The second dummy solder pattern 252D may include a metal material that is different from that of the second dummy pillar 232D. The second dummy solder pattern 252D may include a solder material. The semiconductor device 10 may include a plurality of second dummy pillars 232D and a plurality of second dummy solder patterns 252D. The second dummy pitch P2 may correspond to the pitch between the plurality of second dummy pillars 232D.

The second signal bumps 202S may be provided on the lower surface of the second signal regions SR2 of the semiconductor substrate 100. As shown in FIG. 1D, the second signal bumps 202S may be provided on the lower surfaces of the lower connection pads 110C and connected to the lower connection pads 110C. Accordingly, the second signal bumps 202S may be electrically connected to the through-vias 170 and/or the integrated circuits via the lower connection pads 110C and the wiring patterns 130.

The second signal bumps 202S may have a second signal pitch P20. The second signal pitch P20 may be greater than the first signal pitch P10. For example, the second signal pitch P20 may be about 25 μm to about 55 μm. The second signal pitch P20 is 55 μm or less, and thus, the semiconductor device 10 may be highly integrated.

Each of the second signal bumps 202S may include a second signal pillar 232S and a second signal solder pattern 252S, as shown in FIG. 1D. The second signal pillar 232S may be located between the lower connection pad 110C corresponding thereto and the second signal solder pattern 252S. For example, the second signal pillar 232S may include copper. The second signal solder pattern 252S may be formed by attaching a solder ball to the lower surface of the second signal pillar 232S. The second signal solder pattern 252S may include a metal material that is different from that of the second signal pillar 232S. For example, the second signal solder pattern 252S may include a solder material. The semiconductor device 10 may include a plurality of second signal pillars 232S and a plurality of second signal solder patterns 252S. The second signal pitch P20 may correspond to the pitch between the plurality of second signal pillars 232S.

The voltage bumps 200PG may be provided on the lower surfaces of the voltage supply regions PGR of the semiconductor substrate 100. The voltage bumps 200PG may form voltage bump groups 200G as shown in FIG. 1A. Each of the voltage bump groups 200G may include a plurality of voltage bumps 200PG. The voltage bump groups 200G may be spaced apart from each other. In any one of the voltage bump groups 200G, the plurality of voltage bumps 200PG may be arranged in a row direction and a column direction to thereby form an array in a plan view. However, the arrangement of the voltage bumps 200PG in a plan view in any one of the voltage bump groups 200G may be modified into various patterns.

The voltage bumps 200PG may have a voltage pitch P3. The voltage pitch P3 may correspond to the pitch between the voltage bumps 200PG in any one of the voltage bump groups 200G. The voltage pitch P3 may be much less than the distance between the voltage bump groups 200G. The voltage pitch P3 may be greater than the first signal pitch P10. The voltage pitch P3 may be greater than the second signal pitch P20. The voltage pitch P3 may be less than the first dummy pitch P1 and the second dummy pitch P2. For example, the voltage pitch P3 may be about 45 μm to about 65 μm. The voltage pitch P3 is 65 μm or less, and thus, the semiconductor device 10 may be reduced in size.

The voltage bumps 200PG may be provided on the lower surfaces of the lower connection pads 110C, as shown in FIG. 1C. The voltage bumps 200PG may be electrically connected to the through-vias 170 and/or the integrated circuits via the wiring patterns 130. The voltage bumps 200PG may supply voltage to the through-vias 170 and/or the integrated circuits which are electrically connected to the voltage bumps 200PG. The voltage may include ground voltage or power supply voltage. The voltage bumps 200PG may be electrically separated from the first and second signal bumps 201S and 202S. The voltage bumps 200PG may not be electrically connected to the first and second dummy bumps 201D and 202D.

Each of the voltage bumps 200PG may include a voltage pillar 230PG and a voltage solder pattern 250PG. The voltage pillar 230PG may be located between the lower connection pad 110C corresponding thereto and the voltage solder pattern 250PG. The voltage pillar 230PG may include, for example, copper. The voltage solder pattern 250PG may be formed by attaching a solder ball to the lower surface of the voltage pillar 230PG. The voltage solder pattern 250PG may include a metal material that is different from that of the voltage pillar 230PG. For example, the voltage solder pattern 250PG may include a solder material. The semiconductor device 10 may include a plurality of voltage pillars 230PG and a plurality of voltage solder patterns 250PG. The voltage pitch P3 may correspond to the pitch between the plurality of voltage pillars 230PG.

According to example embodiments, a width W10 of each of the first signal bumps 201S may be substantially equal to a width W20 of each of the second signal bumps 202S, a width W1 of each of the first dummy bumps 201D, and a width W2 of the second dummy bumps 202D. Accordingly, processes of manufacturing the first signal bumps 201S, the second signal bumps 202S, the first dummy bumps 201D, and the second dummy bumps 202D may be simplified. The width W3 of each of the voltage bumps 200PG may be substantially equal to the width W10 of the first signal bumps 201S, the width W20 of the second signal bumps 202S, the width W1 of the first dummy bumps 201D, and the width W2 of the second dummy bumps 202D. However, the example embodiments are not limited thereto. The fact that the widths, lengths, levels, or thicknesses of certain components are the same may indicate that error ranges occurring during processes are the same. The width W10 of each of the first signal bumps 201S may represent the width of each of the first signal pillars 231S. The width W20 of each of the second signal bumps 202S may represent the width of each of the second signal pillars 232S. The width W1 of each of the first dummy bumps 201D may represent the width of each of the first dummy pillars 231D. The width W2 of each of the second dummy bumps 202D may represent the width of each of the second dummy pillars 232D. The width W3 of each of the voltage bumps 200PG may represent the width of the each of the voltage pillars 230PG.

According to some example embodiments, at least two types of bumps among the first signal bumps 201S, the second signal bumps 202S, the first dummy bumps 201D, the second dummy bumps 202D, and the voltage bumps 200PG may be formed by a single process. For example, the first signal bumps 201S may be formed by a single process with the second signal bumps 202S, the first dummy bumps 201D, the second dummy bumps 202D, and the voltage bumps 200PG. The fact that bumps are formed by a single process may include forming pillars by the single process and forming solder patterns by the single process. For example, the first signal pillars 231S may be formed by a single process with the second signal pillars 232S, the first dummy pillars 231D, the second dummy pillars 232D, and the voltage pillars 230PG. The first signal solder patterns 251S may be formed by a single process with the second signal solder patterns 252S, the first dummy solder patterns 251D, the second dummy solder patterns 252D, and the voltage solder patterns 250PG.

The first signal pillars 231S may include the same metal material as the second signal pillars 232S, the first dummy pillars 231D, the second dummy pillars 232D, and the voltage pillars 230PG. The first signal solder patterns 251S may include the same material as the second signal solder patterns 252S, the first dummy solder patterns 251D, the second dummy solder patterns 252D, and the voltage solder patterns 250PG. The composition ratio of the first signal solder patterns 251S may be substantially the same as the composition ratio of the second signal solder patterns 252S, the composition ratio of the first dummy solder patterns 251D, the composition ratio of the second dummy solder patterns 252D, and the composition ratio of the voltage solder patterns 250PG.

According to some example embodiments, the planar arrangement of the lower connection pads 110C may be substantially the same as or similar to the planar arrangements of the first and second signal bumps 201S and 202S and the voltage bumps 200PG. The planar arrangement of the upper connection pads 120C may be substantially the same as or similar to the planar arrangement of the lower connection pads 110C. The planar arrangement of the lower dummy pads 110D may be substantially the same as or similar to the planar arrangements of the first and second dummy bumps 201D and 202D. The planar arrangement of the upper dummy pads 120D may be substantially the same as or similar to the planar arrangement of the lower dummy pads 110D.

Figure 2A:
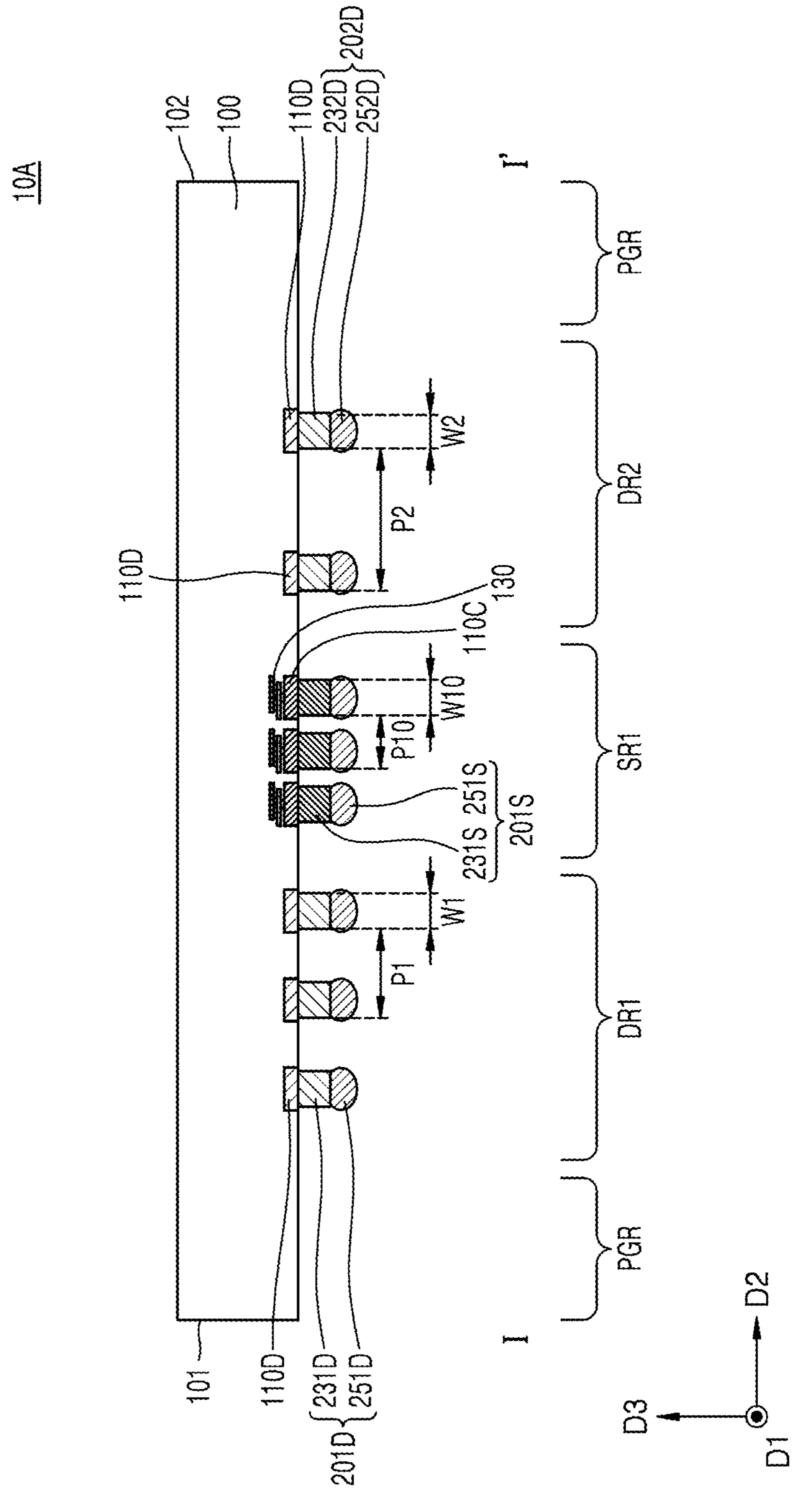
FIG. 2A is a diagram illustrating a semiconductor device according to some example embodiments and corresponds to a cross-section taken along line I-I' of FIG. 1A.
Figure 2B:
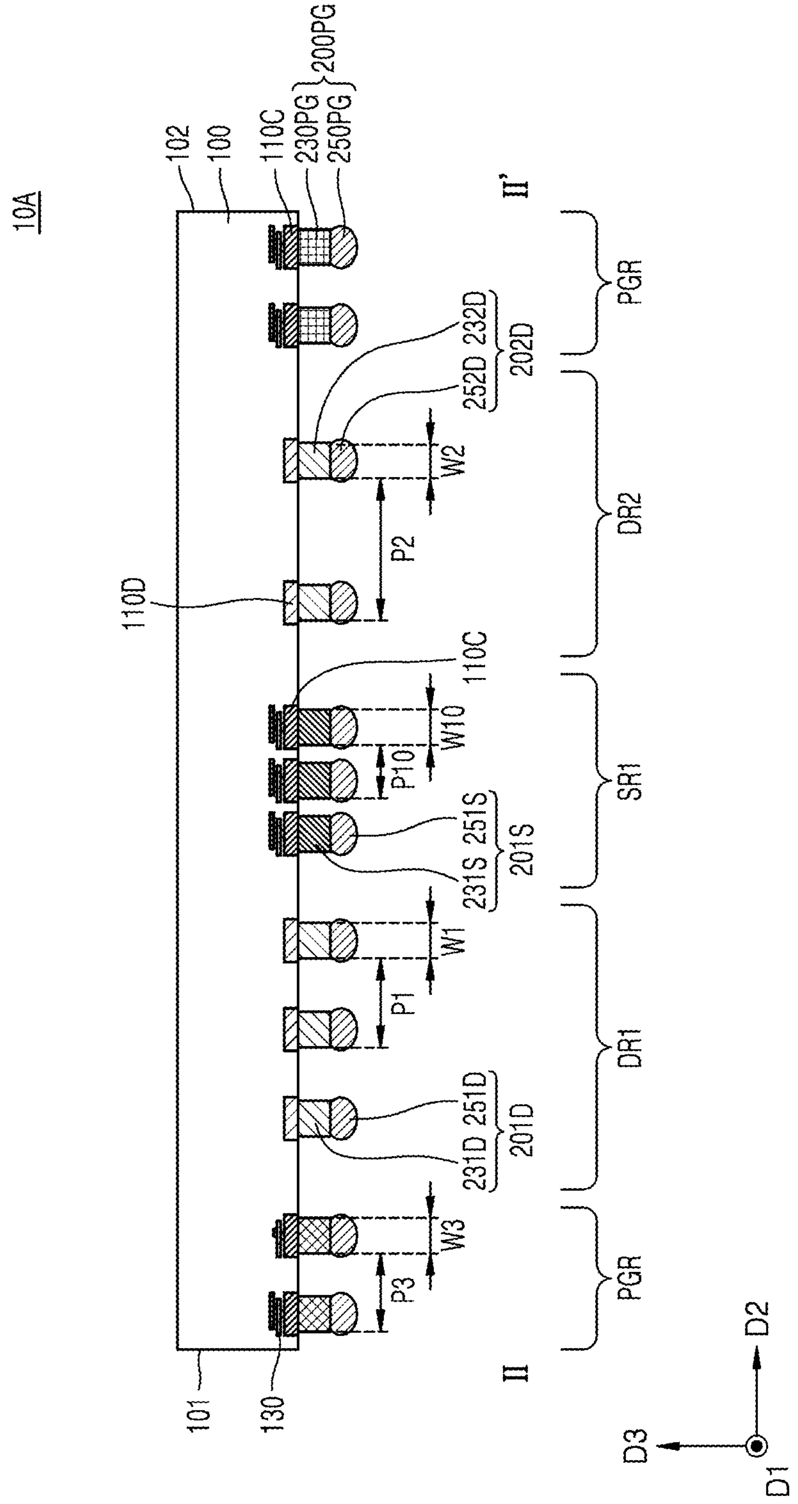
FIG. 2B is a diagram illustrating the semiconductor device according to some example embodiments and corresponds to a cross-section taken along line II-II' of FIG. 1A.
Figure 2C:
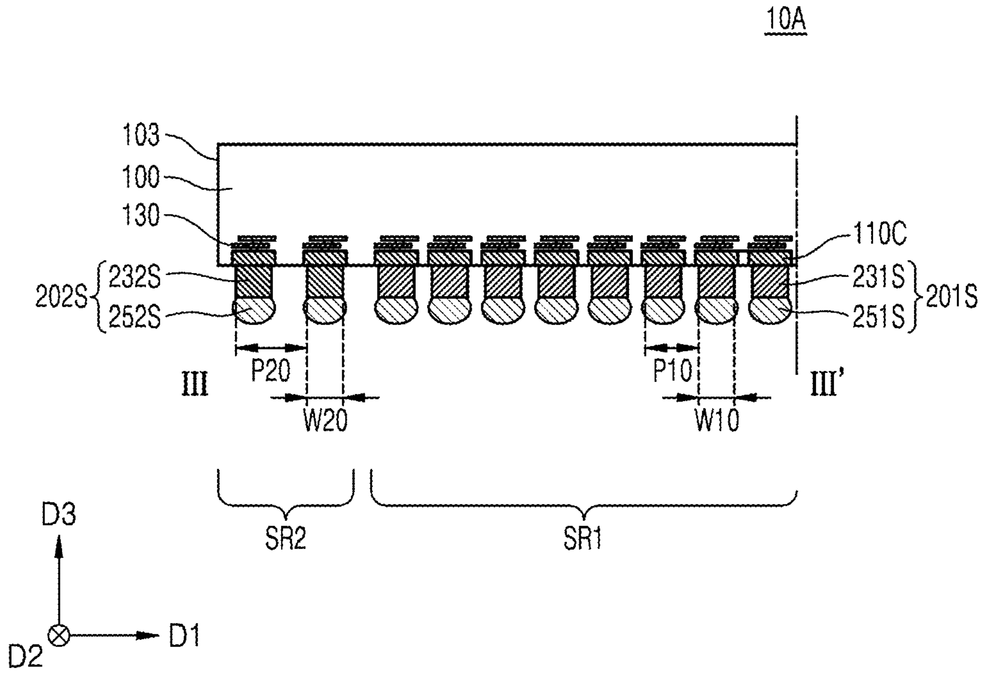
FIG. 2C is a diagram illustrating the semiconductor device according to some embodiments and corresponds to a cross-section taken along line III-III' of FIG. 1A.

FIG. 2A is a diagram illustrating a semiconductor device 10A according to some example embodiments and corresponds to a cross-section taken along line I-I' of FIG. 1A. FIG. 2B is a diagram illustrating the semiconductor device 10A according to some example embodiments and corresponds to a cross-section taken along line II-II' of FIG. 1A. FIG. 2C is a diagram illustrating the semiconductor device 10A according to some example embodiments and corresponds to a cross-section taken along line III-III' of FIG. 1A.

Referring to FIGS. 2A to 2C together with FIG. 1A, the semiconductor device 10A may include a semiconductor substrate 100, wiring patterns 130, lower connection pads 110C, lower dummy pads 110D, first signal bumps 201S, first dummy bumps 201D, and second dummy bumps 202D. The semiconductor device 10A may further include second signal bumps 202S and voltage bumps 200PG. However, the semiconductor device 10A may not include the upper connection pads 120C, the upper dummy pads 120D, and the through-vias 170, which are described above in the examples of FIGS. 1B to 1D. The arrangements and electrical connection relationships of the first signal bumps 201S, the second signal bumps 202S, the first dummy bumps 201D, the second dummy bumps 202D, and the voltage bumps 200PG may be the same as those described above in the examples of FIGS. 1A to 1D.

Figure 3A:
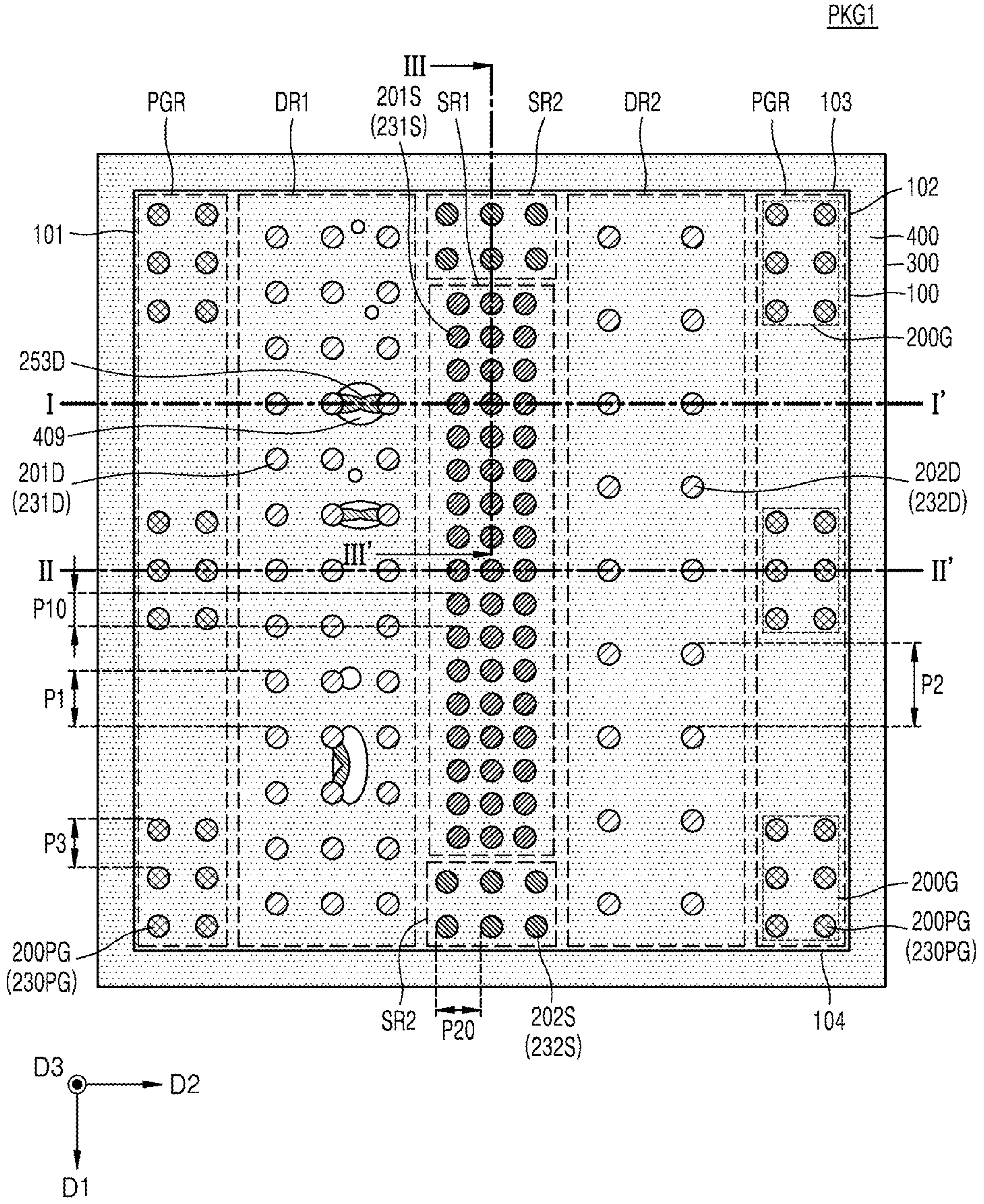
FIG. 3A is a plan view illustrating a semiconductor package according to some example embodiments.
Figure 3B:
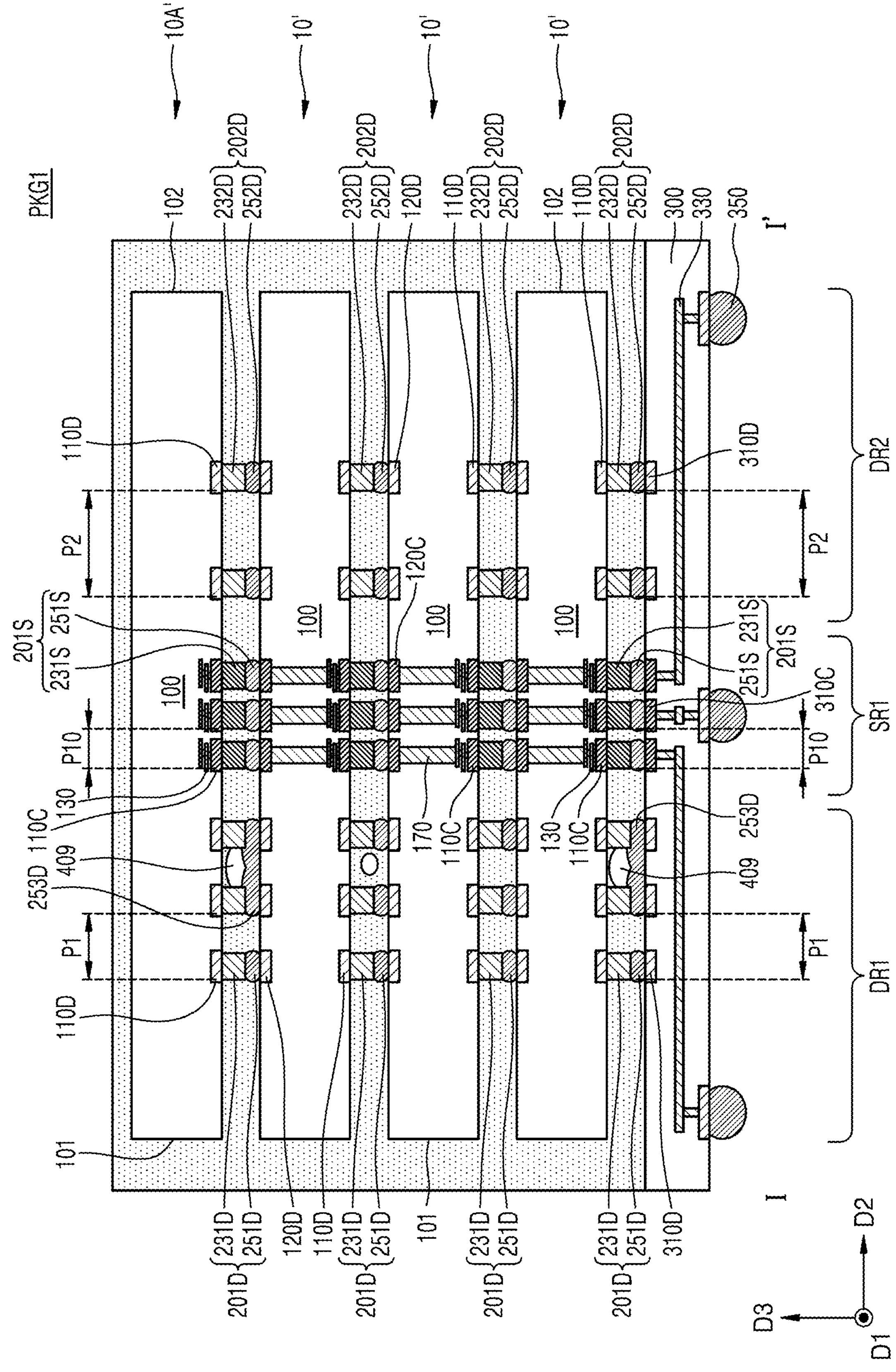
FIG. 3B is a cross-section of the semiconductor device taken along line I-I' of FIG. 3A.
Figure 3C:
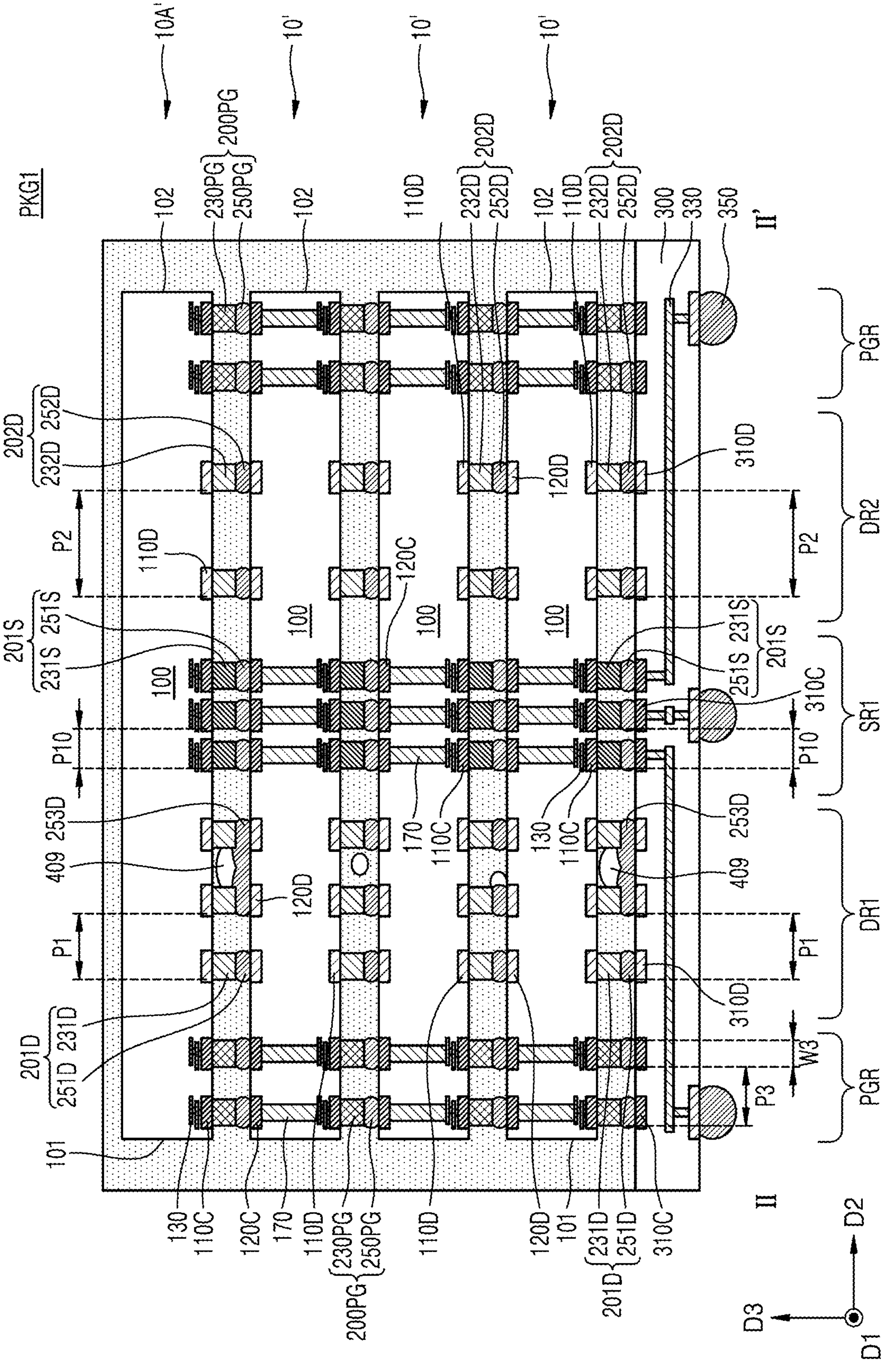
FIG. 3C is a cross-section of the semiconductor device taken along line II-II' of FIG. 3A.
Figure 3D:
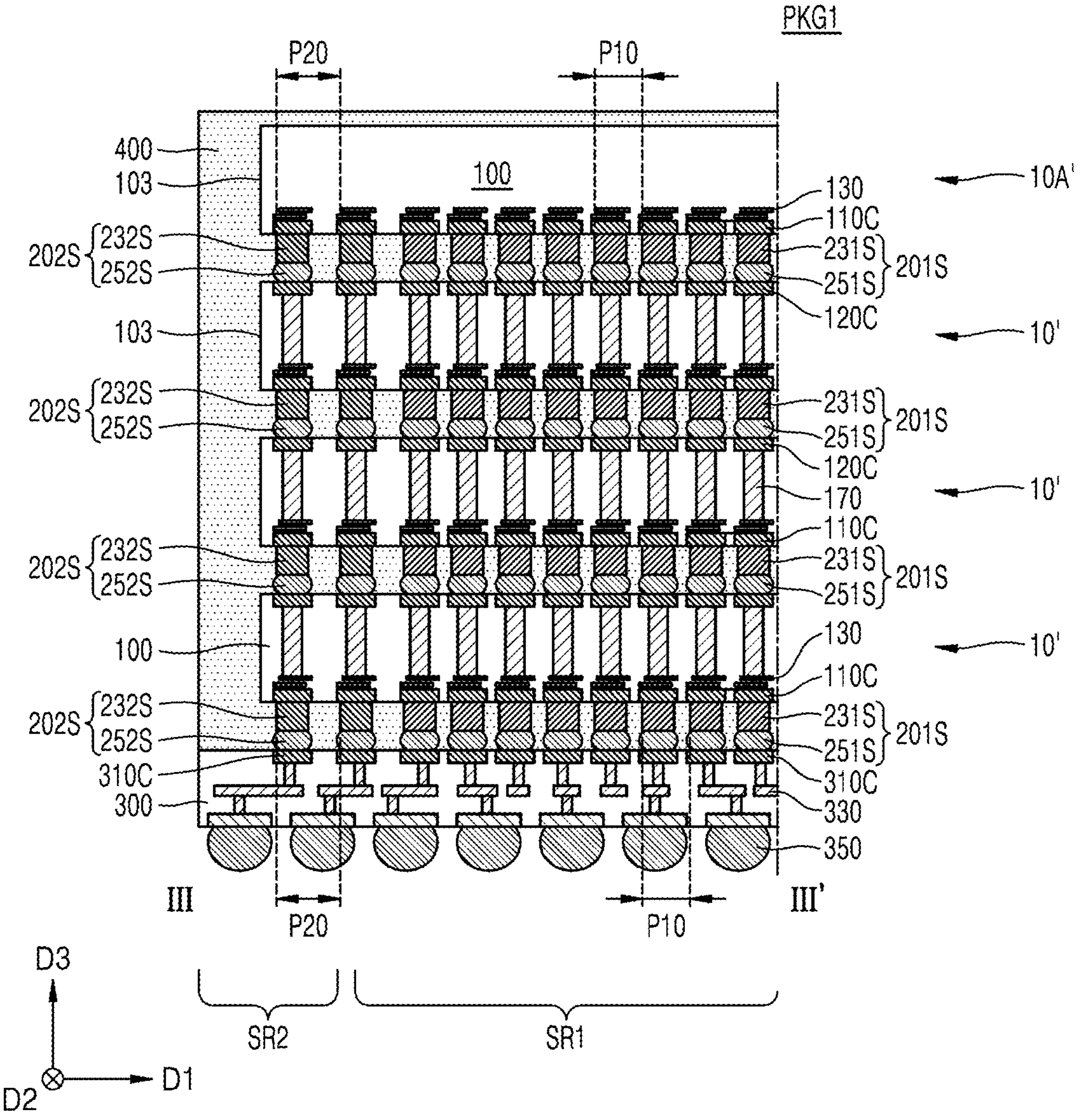
FIG. 3D is a cross-section of the semiconductor device taken along line III-III' of FIG. 3A.

FIG. 3A is a plan view illustrating a semiconductor package PKG1 according to some example embodiments. FIG. 3B is a cross-section of the semiconductor device taken along line I-I' of FIG. 3A. FIG. 3C is a cross-section of the semiconductor device taken along line II-II' of FIG. 3A. FIG. 3D is a cross-section of the semiconductor device taken along line III-III' of FIG. 3A.

Referring to FIGS. 3A to 3D, the semiconductor package PKG1 may include a package substrate 300, solder ball terminals 350, semiconductor chips, and a molding film 400. The semiconductor chips may include a plurality of first semiconductor chips 10' stacked on each other and a second semiconductor chip 10A'. Unlike the above, the semiconductor package PKG1 may include more than a single first semiconductor chip 10'.

The package substrate 300 may include a printed circuit board having a circuit pattern. The package substrate 300 may include connection substrate pads 310C, dummy substrate pads 310D, and substrate wires 330. The connection substrate pads 310C and the dummy substrate pads 310D may be provided on the upper surface of the package substrate 300. The dummy substrate pads 310D may be laterally spaced apart from the connection substrate pads 310C and electrically insulated from the connection substrate pads 310C. The substrate wires 330 may be provided in the package substrate 300 and connected to the connection substrate pads 310C. The fact that a component is connected to the package substrate 300 may represent connecting the component to at least one of the connection substrate pads 310C. The dummy substrate pads 310D may be spaced apart from the substrate wires 330 and electrically insulated from the substrate wires 330. Each of the connection substrate pads 310C, the dummy substrate pads 310D, and the substrate wires 330 may include metals, such as copper, aluminum, tungsten, and titanium.

The solder ball terminals 350 may be disposed on the lower surface of the package substrate 300 and electrically connected to the substrate wires 330. External electrical signals or voltages may be transmitted to the package substrate 300 via the solder ball terminals 350. For example, the external electrical signals and voltages may be transmitted to the connection substrate pads 310C via the substrate wires 330. The external electrical signals and voltages may not be transmitted to the dummy substrate pads 310D. Each of the solder ball terminals 350 may include a solder ball, a pillar, a bump, or a combination thereof. The solder ball terminals 350 may include metal, such as a solder material.

Each of the first semiconductor chips 10' may be substantially the same as the semiconductor device 10 described above in the examples of FIGS. 1A to 1D. For example, the semiconductor device 10 described above in the examples of FIGS. 1A to 1D may be stacked on the package substrate 300 to thereby form one of the first semiconductor chips 10'. The semiconductor device 10 may be repeatedly stacked thereon, and thus, a plurality of first semiconductor chips 10' may be provided. Accordingly, as described above in the examples of FIGS. 1A to 1D, each of the first semiconductor chips 10' may include a semiconductor substrate 100, integrated circuits, wiring patterns 130, lower connection pads 110C, lower dummy pads 110D, upper connection pads 120C, upper dummy pads 120D, through-vias 170, first signal bumps 201S, second signal bumps 202S, first dummy bumps 201D, second dummy bumps 202D, and voltage bumps 200PG. The semiconductor substrate 100 of each of the first semiconductor chips 10' may be referred to as a first semiconductor substrate.

The first signal bumps 201S, the second signal bumps 202S, and the voltage bumps 200PG of a lowermost first semiconductor chip 10' may be disposed on the connection substrate pads 310C and electrically connected to the connection substrate pads 310C. Accordingly, the lowermost first semiconductor chip 10' may transmit electrical signals to and receive electrical signals from the solder ball terminals 350 corresponding thereto via the first signal bumps 201S and the second signal bumps 202S. The electrical signals may include data signals, processing signals, and/or memory signals. The lowermost first semiconductor chip 10' may receive voltage from the solder ball terminals 350 corresponding thereto via the voltage bumps 200PG. The first dummy bumps 201D and the second dummy bumps 202D of the lowermost first semiconductor chip 10' may be disposed on the dummy substrate pads 310D and bonded to the dummy substrate pads 310D. The first dummy bumps 201D and the second dummy bumps 202D may be insulated from the substrate wires 330 and the solder ball terminals 350.

The adjacent first semiconductor chips 10' may include a first lower semiconductor chip and a first upper semiconductor chip. The first signal bumps 201S, the second signal bumps 202S, and the voltage bumps 200PG of the first upper semiconductor chip may be disposed on the upper connection pads 120C of the first lower semiconductor chip and electrically connected to the upper connection pads 120C of the first lower semiconductor chip. The first and second signal bumps 201S and 202S may function as a path for the electrical signals between the first semiconductor chips 10'. For example, the first semiconductor chips 10' may exchange electrical signals with each other or exchange electrical signals with an external device, via the first and second signal bumps 201S and 202S and the through-vias 170 electrically connected thereto. The voltage bumps 200PG may function as a path for voltage supply to the first semiconductor chips 10'. For example, the voltage supplied from the solder ball terminals 350 may be applied to the first semiconductor chips 10', via the voltage bumps 200PG and the through-vias 170 electrically connected thereto.

The first dummy bumps 201D and the second dummy bumps 202D of the first upper semiconductor chip may be disposed on the upper dummy pads 120D of the first lower semiconductor chip and bonded to the upper dummy pads 120D of the first lower semiconductor chip. When the first and second dummy bumps 201D and 202D are omitted, stress may be applied to the first and second dummy regions DR1 and DR2. The stress may include mechanical stress and thermal stress. According to some example embodiments, the first dummy bumps 201D may be arranged on the first dummy region DR1 of the semiconductor substrate 100 and the second dummy bumps 202D may be arranged on the second dummy region DR2 of the semiconductor substrate 100. The stress may be relieved or reduced by the first and second dummy bumps 201D and 202D. For example, the first and second dummy bumps 201D and 202D may function as support bumps and physically support the first semiconductor chips 10'. The first and second dummy bumps 201D and 202D may have higher thermal conductivity than the molding film 400. When the semiconductor package PKG1 operates, the first and second dummy bumps 201D and 202D may radiate heat generated from the first semiconductor chips 10' to the outside. Accordingly, the thermal characteristics of the semiconductor package PKG1 may be improved.

According to some example embodiments, the first dummy pitch P1 is 80 μm or less, and thus, the first dummy bumps 201D may sufficiently relieve or reduce the stress applied to the first semiconductor chips 10'. For example, the first dummy pitch P1 is 80 μm or less, and thus, the first dummy bumps 201D may stably support the first and second semiconductor chips 10' and 10A' and quickly dissipate the heat generated by the first semiconductor chips 10'.

The second semiconductor chip 10A' may be disposed on an uppermost first semiconductor chip 10'. The second semiconductor chip 10A' may be substantially the same as the semiconductor device 10A described above in the examples of FIGS. 2A to 2C. For example, the semiconductor device 10A described above in the examples of FIGS. 2A to 2C may be stacked on the uppermost first semiconductor chip 10' to thereby form the second semiconductor chip 10A'. As described above in the examples of FIGS. 2A to 2C, the second semiconductor chip 10A' may include a semiconductor substrate 100, integrated circuits, wiring patterns 130, lower connection pads 110C, lower dummy pads 110D, first signal bumps 201S, second signal bumps 202S, first dummy bumps 201D, second dummy bumps 202D, and voltage bumps 200PG, but may not include upper connection pads 120C, upper dummy pads 120D, and through-vias 170. For example, the semiconductor substrate 100 of the second semiconductor chip 10A' may be referred to as a second semiconductor substrate. In the second semiconductor chip 10A', the integrated circuits, the wiring patterns 130, the first signal bumps 201S, the second signal bumps 202S, the first dummy bumps 201D, the second dummy bumps 202D, and the voltage bumps 200PG may be referred to as upper integrated circuits, upper wiring patterns 130, first upper signal bumps 201S, second upper signal bumps 202S, first upper dummy bumps 201D, second upper dummy bumps 202D, and upper voltage bumps 200PG, respectively. The thickness of the second semiconductor chip 10A' may be greater than the thickness of each of the first semiconductor chips 10'.

The first signal bumps 201S, the second signal bumps 202S, and the voltage bumps 200PG of the second semiconductor chip 10A' may be disposed on the upper connection pads 120C of the uppermost first semiconductor chip 10' and electrically connected to the upper connection pads 120C of the uppermost first semiconductor chip 10'. Accordingly, the second semiconductor chip 10A' may exchange electrical signals with the first semiconductor chips 10' and an external device, via the first signal bumps 201S and the second signal bumps 202S. As shown in FIG. 3C, the second semiconductor chip 10A' may receive voltage from an external device via the voltage bumps 200PG.

The first dummy bumps 201D and the second dummy bumps 202D of the second semiconductor chip 10A' may be disposed on the upper dummy pads 120D of the uppermost first semiconductor chip 10' and bonded to the upper dummy pads 120D of the uppermost first semiconductor chip 10'. The first dummy bumps 201D and the second dummy bumps 202D may support the second semiconductor chip 10A'. When the semiconductor package PKG1 operates, heat generated by the second semiconductor chips 10A' may be quickly discharged to the outside via the first and second dummy bumps 201D and 202D.

The lowermost first semiconductor chip 10' may include a master chip. The first semiconductor chips 10' other than the lowermost first semiconductor chip 10' and the second semiconductor chip 10A' may include slave chips. For example, the lowermost first semiconductor chip 10' may control the other first semiconductor chips 10' and the second semiconductor chip 10A'. The other first semiconductor chips 10' and the second semiconductor chip 10A' may be operated according to commands from the lowermost first semiconductor chip 10'. However, the types of the first semiconductor chips 10' and the type of the second semiconductor chip 10A' are not limited thereto and modified in various forms.

The molding film 400 may be disposed above the upper surface of the package substrate 300 and cover side surfaces of the first semiconductor chips 10' and side surfaces of the second semiconductor chip 10A'. For example, the molding film 400 may cover the first to fourth side surfaces 101, 102, 103, and 104 of the semiconductor substrate 100 of each of the first and second semiconductor chips 10' and 10A'. The molding film 400 may further cover the upper surface of the second semiconductor chip 10A'. The molding film 400 may include a molded underfill. For example, the molding film 400 may extend into a first gap region between the package substrate 300 and the lowermost first semiconductor chip 10', second gap regions between the first semiconductor chips 10', and a third gap region between the uppermost first semiconductor chip 10' and the second semiconductor chip 10A'. The molding film 400 may cover the sidewalls of the first and second signal bumps 201S and 202S, the sidewalls of the voltage bumps 200PG, and the sidewalls of the second dummy bumps 202D. The molding film 400 on the sidewalls of the first and second semiconductor chips 10' and 10A' may include the same material and have the same composition ratio as the molding film 400 in the first and third gap regions. The molding film 400 may include an insulating polymer, such as an epoxy-based molding compound.

The molding film 400 may have a void 409 therein. The void 409 may be provided on the lower surface of at least one of the first and second semiconductor chips 10' and 10A'. For example, the void 409 may include at least one of a first void provided between the package substrate 300 and the lowermost first semiconductor chip 10', a second void between the first semiconductor chips 10', and a third void between the uppermost first semiconductor chip 10' and the second semiconductor chip 10A'.

The void 409 may be located between adjacent first dummy pillars 231D among the first dummy pillars 231D in a plan view. The void 409 may be provided in plurality. At least one void 409 among the plurality of voids 409 may expose the sidewalls of the adjacent first dummy pillars 231D, but the example embodiments are not limited thereto. The voids 409 may not be provided in the first and second signal regions SR1 and SR2, the voltage supply regions PGR, and the second dummy region DR2 of the semiconductor substrate 100. The voids 409 may include an empty space occupied by air or gas. In another example, the voids 409 may be in a vacuum state. The planar shape and size of the voids 409 may be variously modified.

Hereinafter, formation of the molding film 400 and the voids 409 are described below. Also, the first and second dummy bumps 201D and 202D during the formation of the voids 409 are described below. Hereinafter, a singular void 409 is described below for simplicity of description.

Figure 4A:
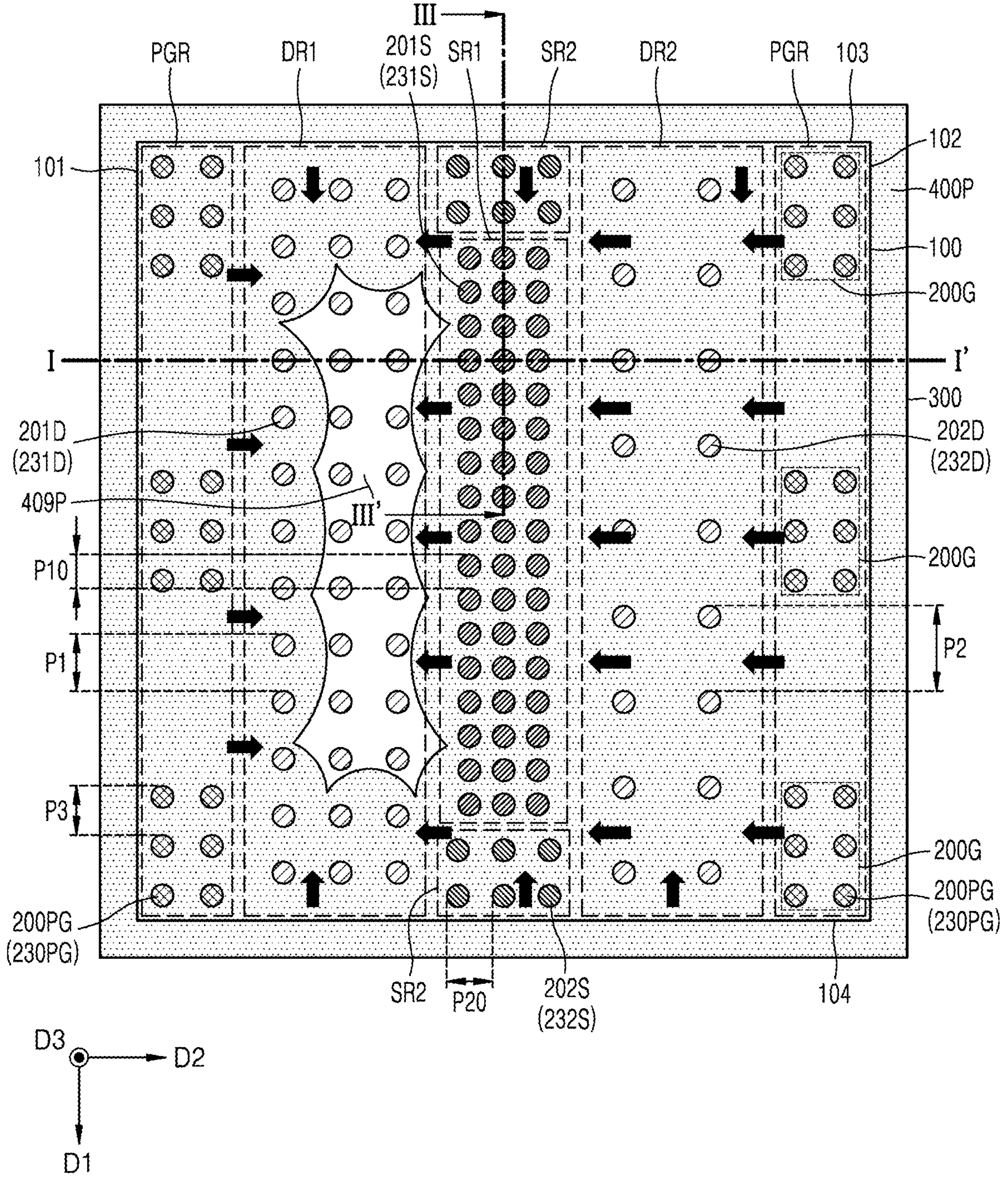
FIG. 4A is a plan view illustrating a process of forming a molding film in a semiconductor package, according to some example embodiments.
Figure 4B:
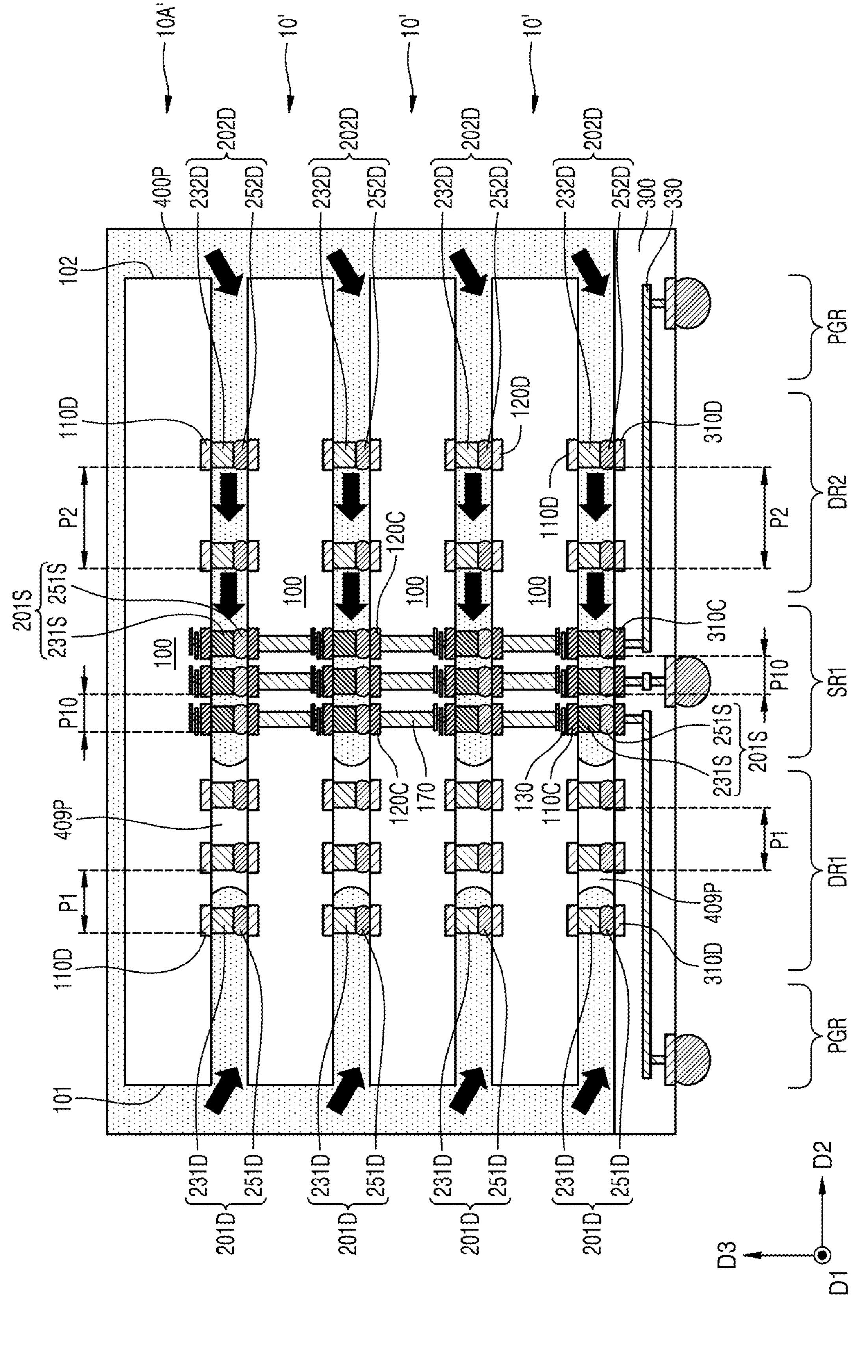
FIG. 4B is a cross-section taken along line I-I' of FIG. 4A.

FIG. 4A is a plan view illustrating a process of forming a molding film in a semiconductor package, according to some example embodiments. FIG. 4B is a diagram illustrating the process of forming the molding film in the semiconductor package according to some example embodiments and shows a cross-section of the semiconductor package taken along line I-I' of FIG. 4A.

Referring to FIGS. 4A and 4B, the first semiconductor chips 10' may be stacked on the package substrate 300. The second semiconductor chip 10A' may be disposed on the uppermost first semiconductor chip 10'. Subsequently, a preliminary molding film 400P may be formed and cover the upper surface of the package substrate 300, the first semiconductor chips 10', and the second semiconductor chip 10A'. The preliminary molding film 400P may be formed by a compression molding method. For example, the package substrate 300 may be turned over such that the second semiconductor chip 10A' is oriented downward. An insulating polymer, such as an epoxy-based molding compound, may be provided in a tray (not shown), and the insulating polymer may be converted into a liquid state by heating. The package substrate 300 may be lowered so that the first semiconductor chips 10' and the second semiconductor chip 10A' are immersed in the insulating polymer. Accordingly, the preliminary molding film 400P may be formed and cover the side surfaces of the first semiconductor chips 10' and the side surfaces of the second semiconductor chip 10A'. Particularly, the preliminary molding film 400P may cover the first to fourth side surfaces 101, 102, 103, and 104 of the semiconductor substrate 100 of each of the first and second semiconductor chips 10' and 10A'. The preliminary molding film 400P may be in a liquid state.

As pressure is applied to the package substrate 300 and the tray, the preliminary molding film 400P may flow into the first gap region between the package substrate 300 and the lowermost first semiconductor chip 10', the second gap regions between the first semiconductor chips 10', and the third gap region between the uppermost first semiconductor chip 10' and the second semiconductor chip 10A'. As indicated by arrows, the preliminary molding film 400P may flow from the first to fourth side surfaces 101, 102, 103, and 104 of the semiconductor substrate 100 onto the lower surface of the semiconductor substrate 100. For example, the preliminary molding film 400P (e.g., a first portion of the preliminary molding film 400P) may flow from the first side surface 101 of the semiconductor substrate 100 into the first dummy region DR1, via the corresponding voltage supply region PGR on the lower surface of the semiconductor substrate 100. Similarly, the preliminary molding film 400P (e.g., a second portion of the preliminary molding film 400P) may flow from the second side surface 102 of the semiconductor substrate 100 into the second dummy region DR2, via the corresponding voltage supply region PGR on the lower surface of the semiconductor substrate 100. The voltage bump groups 200G may be spaced apart from each other by relatively large distances in the voltage supply regions PGR of the semiconductor substrate 100, and thus, the preliminary molding film 400P may quickly and easily fill spaces between the voltage bump groups 200G of the semiconductor substrate 100. In any one of the voltage bump groups 200G, the voltage bumps 200PG have the voltage pitch P3 of 45 μm or more. Accordingly, the preliminary molding film 400P may easily fill spaces between the voltage bumps 200PG and easily pass through between the voltage bumps 200PG. Accordingly, a preliminary void 409P may not be formed in the voltage supply regions PGR of the semiconductor substrate 100.

According to some example embodiments, the first dummy pitch P1 and the second dummy pitch P2 are 55 μm or more, and thus, the preliminary molding film 400P may flow relatively quickly between the first dummy bumps 201D and the second dummy bumps 202D. Accordingly, the process time required to manufacture the semiconductor package may be reduced and the preliminary molding film 400P may be formed relatively efficiently.

According to some example embodiments, the second dummy pitch P2 may be greater than the first dummy pitch P1 and the first signal pitch P10. The second dummy bumps 202D may be sparsely arranged, and thus, the preliminary molding film 400P may flow very quickly and smoothly in the second dummy region DR2 of the semiconductor substrate 100. The moving speed of the preliminary molding film 400P in the second dummy region DR2 of the semiconductor substrate 100 may be greater than the moving speed of the preliminary molding film 400P in the first dummy region DR1. Particularly, the moving speed of the second portion of the preliminary molding film 400P flowing from the second side surface 102 of the semiconductor substrate 100 toward the first signal region SR1 via the second dummy region DR2 may be greater than the moving speed of the first portion of the preliminary molding film 400P flowing from the first side surface 101 of the semiconductor substrate 100 toward the first signal region SR1. When the second portion of the preliminary molding film 400P completely fills spaces between the first signal bumps 201S, the first portion of the preliminary molding film 400P may not reach the first signal region SR1. Accordingly, the preliminary void 409P of the preliminary molding film 400P may not be formed in the first signal region SR1 and the second dummy region DR2. The preliminary void 409P of the preliminary molding film 400P may be formed in the first dummy region DR1.

Referring to FIG. 4A, the preliminary molding film 400P (e.g., third portions of the preliminary molding film 400P) may flow from the third side surface 103 and the fourth side surface 104 of the semiconductor substrate 100 to the first signal region SR1, via the second signal regions SR2 of the semiconductor substrate 100. The second signal pitch P20 may be greater than the first signal pitch P10. Accordingly, the third portions of the preliminary molding film 400P may quickly and easily flow through the second signal regions SR2. The process of forming the preliminary molding film 400P may be performed more effectively. The preliminary void 409P may not be formed in the second signal regions SR2 of the semiconductor substrate 100.

As the flow of the preliminary molding film 400P continues, the volume of the preliminary void 409P may be reduced. However, even as time passes, some of preliminary voids 409P may remain in the first dummy region DR1 of the semiconductor substrate 100.

Referring back to FIGS. 3A to 3C, the preliminary molding film 400P may be solidified by a cooling process to form the molding film 400. The preliminary void 409P remaining in the preliminary molding film 400P may form the void 409 in the molding film 400. The manufacturing of the semiconductor package PKG1 may be completed by the manufacturing examples described above.

The void 409 may be provided in the first dummy region DR1 of the semiconductor substrate 100 and may be formed between adjacent first dummy pillars 231D. A dummy agglomerate solder 253D may be provided in the first gap region, the second gap regions, or the third gap region. During the process of forming the molding film 400, sidewalls of the first dummy solder patterns 251D on the lower surfaces of adjacent first dummy pillars 231D may be exposed to the void 409. During a reflow process of the first dummy solder patterns 251D, the first dummy solder patterns 251D may be melted. The melted first dummy solder patterns 251D may flow into the void 409 and be connected to each other. Accordingly, the dummy agglomerate solder 253D may be formed. Both end portions of the dummy agglomerate solder 253D may be respectively provided on the lower surfaces of the adjacent second dummy pillars 232D. Both end portions of the dummy agglomerate solder 253D may be respectively provided on the upper surfaces of the adjacent upper dummy pads 120D. For example, when the void 409 is formed in the second gap regions or the third gap region, both end portions of the dummy agglomerate solder 253D may be respectively provided on the upper surfaces of at least two adjacent upper dummy pads 120D. When the void 409 is formed in the first gap region, both end portions of the dummy agglomerate solder 253D may be respectively provided on the upper surfaces of at least two of the dummy substrate pads 310D.

The middle portion of the dummy agglomerate solder 253D may be located between both end portions of the dummy agglomerate solder 253D. The middle portion of the dummy agglomerate solder 253D may be provided in the void 409 and exposed to the void 409.

The dummy agglomerate solder 253D may not disturb electrical characteristics of the semiconductor package PKG1. The dummy agglomerate solder 253D may physically support the first semiconductor chips 10' and the second semiconductor chip 10A' and dissipate heat generated by the first and second semiconductor chips 10' and 10A'. The semiconductor package PKG1 may include a plurality of dummy agglomerate solders 253D. The plurality of dummy agglomerate solders 253D may be spaced apart from each other. Each of the plurality of dummy agglomerate solders 253D may be provided in the first gap region, the second gap regions, or the third gap region.

When the void 409 is formed between the first signal pillars 231S, the first signal solder patterns 251S on the lower surfaces of the first signal pillars 231S may extend into the void 409 and be connected to each other. Accordingly, an electrical short circuit may occur between the first signal bumps 201S. Similarly, when the void 409 is formed between the second signal bumps 202S, an electrical short circuit may occur between the second signal bumps 202S. According to some example embodiments, the second dummy bumps 202D may be provided and prevent or reduce in likelihood the void 409 from being formed in the first and second signal regions SR1 and SR2 of the semiconductor substrate 100. Accordingly, the first signal solder patterns 251S may not be connected to each other, and the occurrence of an electrical short circuit between the first signal bumps 201S may be prevented or reduced in likelihood. In addition, the second signal solder patterns 252S may be prevented or reduced in likelihood from being connected to each other, and the occurrence of an electrical short circuit between the second signal bumps 202S may be prevented or reduced in likelihood. The void 409 may not be provided in the voltage supply regions PGR of the semiconductor substrate 100, and thus, the occurrence of an electrical short circuit between the voltage bumps 200PG may be prevented or reduced in likelihood. The semiconductor package PKG1 may exhibit improved electrical characteristics and reliability.

As the pitch of bumps decreases, the void 409 may be easily formed between the bumps. In this case, there may be limitations on the pitch of the bumps becoming smaller. According to some example embodiments, the second dummy bumps 202D may prevent or reduce in likelihood the void 409 from being formed in the first signal region SR1 of the semiconductor substrate 100, and thus, the first signal pitch P10 may be smaller or be reduced. For example, the first signal pitch P10 may have a small pitch of 45 μm or less. Accordingly, each of the first semiconductor chips 10' and the second semiconductor chip 10A' may include a greater number of first signal bumps 201S, and the first signal bumps 201S may be arranged highly densely. Accordingly, the first and second semiconductor chips 10' and 10A' may be highly integrated and have high performance.

Figure 5A:
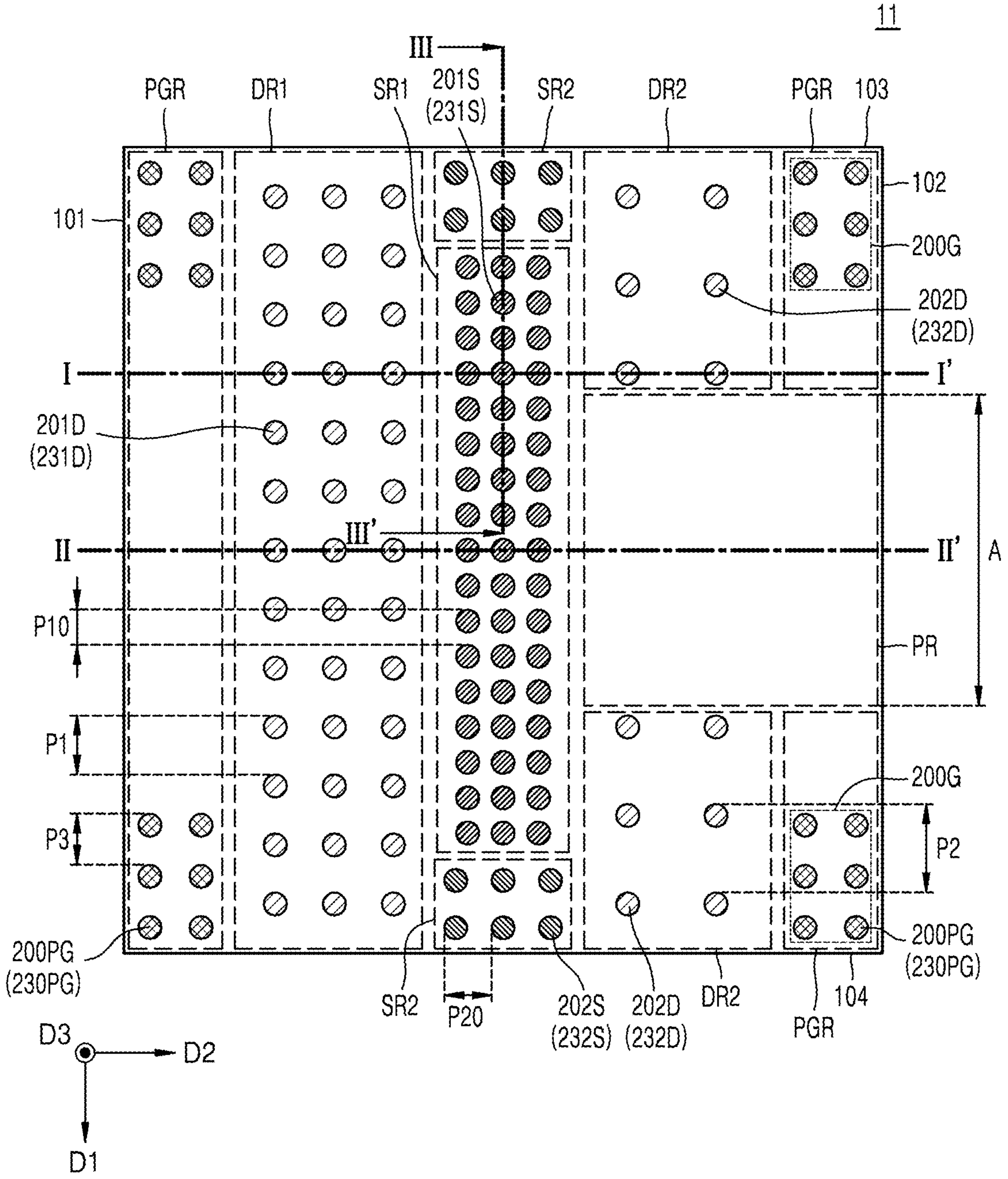
FIG. 5A is a plan view illustrating a semiconductor device according to some example embodiments.
Figure 5B:
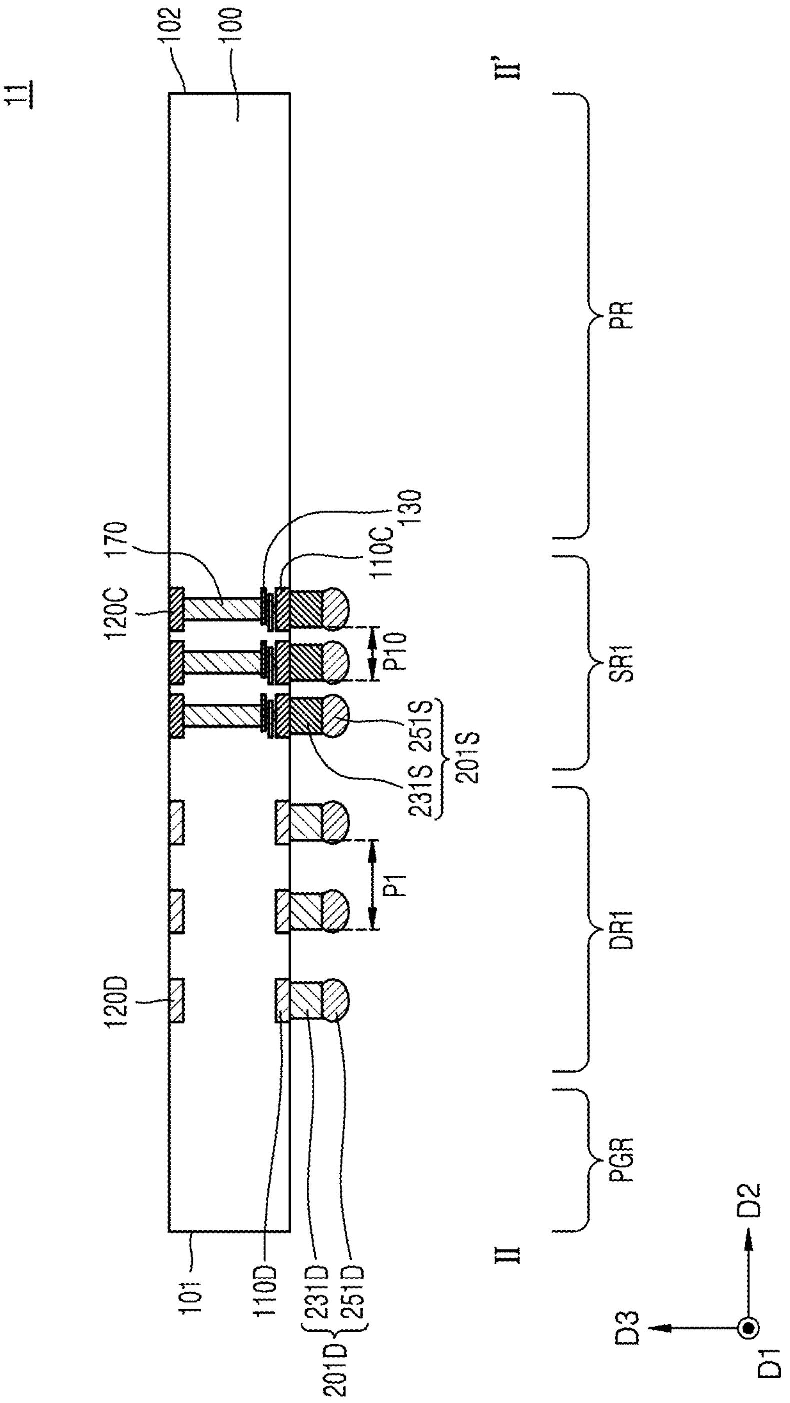
FIG. 5B is a cross-section of the semiconductor device taken along line II-II' of FIG. 5A.

FIG. 5A is a plan view illustrating a semiconductor device 11 according to some example embodiments. FIG. 5B is a cross-section of the semiconductor device 11 taken along line II-II' of FIG. 5A. When describing FIGS. 5A and 5B, FIGS. 1B and 1D are referred to together. A cross-section taken along line I-I' of FIG. 5A may be substantially the same as FIG. 1B. A cross-section taken along line III-III' of FIG. 5A may be substantially the same as FIG. 1D. Hereinafter, repeated descriptions as those given above are omitted.

Referring to FIGS. 5A and 5B, the semiconductor device 11 may include a semiconductor substrate 100, integrated circuits, wiring patterns 130, lower connection pads 110C, lower dummy pads 110D, upper connection pads 120C, upper dummy pads 120D, through-vias 170, first signal bumps 201S, second signal bumps 202S, first dummy bumps 201D, second dummy bumps 202D, and voltage bumps 200PG. In a plan view, the semiconductor substrate 100 may include a passage region PR, in addition to a first signal region SR1, second signal regions SR2, a first dummy region DR1, a plurality of second dummy regions DR2, and voltage supply regions PGR.

In a plan view, the passage region PR of the semiconductor substrate 100 may be located between the second side surface 102 of the semiconductor substrate 100 and the first signal region SR1 of the semiconductor substrate 100. Particularly, the passage region PR of the semiconductor substrate 100 may extend from the second side surface 102 of the semiconductor substrate 100 to the first signal region SR1 of the semiconductor substrate 100. None of the voltage supply regions PGR of the semiconductor substrate 100 may be provided between the passage region PR of the semiconductor substrate 100 and the second side surface 102 of the semiconductor substrate 100. The passage region PR of the semiconductor substrate 100 may be provided between the voltage bump groups 200G. For example, the voltage bump groups 200G may be spaced apart from each other in the first direction D1 with the passage region PR of the semiconductor substrate 100 therebetween. The passage region PR may be provided between the plurality of second dummy regions DR2 of the semiconductor substrate 100. That is, the second dummy regions DR2 of the semiconductor substrate 100 may be spaced apart from each other in the first direction D1 with the passage region PR therebetween. The passage region PR of the semiconductor substrate 100 may not be provided between the first signal region SR1 and the first side surface 101 of the semiconductor substrate 100.

According to some example embodiments, bumps may not be provided on the lower surface of the passage region PR of the semiconductor substrate 100. For example, the first and second signal bumps 201S and 202S, the first and second dummy bumps 201D and 202D, and the voltage bumps 200PG may not be provided in the passage region PR of the semiconductor substrate 100. The passage region PR of the semiconductor substrate 100 may have a passage width A. The passage width A may be a width in the first direction D1. The passage width A may be at least three times of the second dummy pitch P2 in the first direction D1. The passage width A may be less than or equal to ⅓ of the width of the first side surface 101 of the semiconductor substrate 100. The passage width A may be substantially equal to or less than the minimum distance between the second dummy bumps 202D adjacent to the passage region PR in the first direction D1. The width of the first side surface 101 of the semiconductor substrate 100 may be a width in the first direction D1.

Unlike that shown in the drawings, the semiconductor device 11 may not include the upper connection pads 120C, the upper dummy pads 120D, and the through-vias 170.

Figure 6:
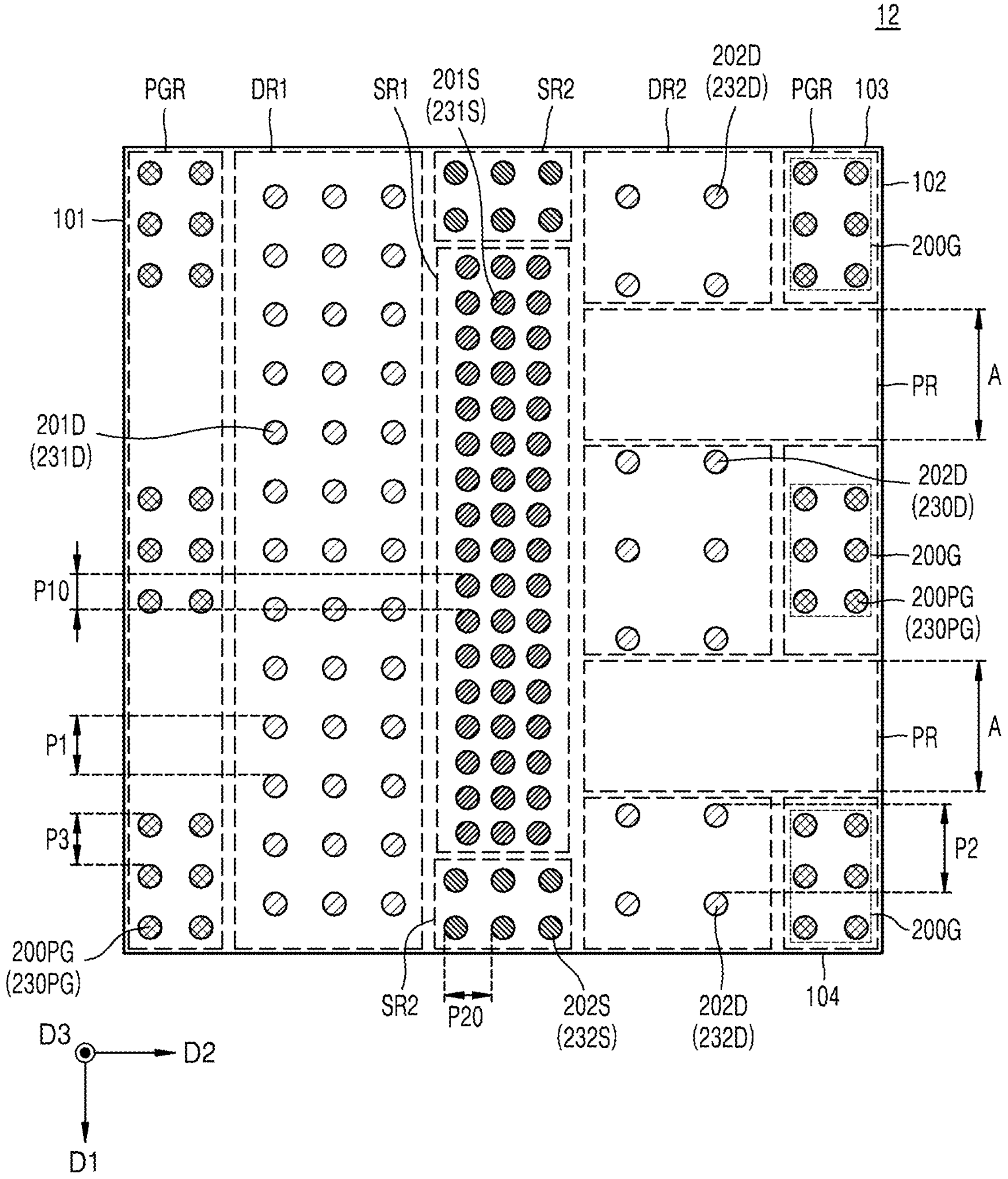
FIG. 6 is a plan view illustrating a semiconductor device according to some example embodiments.

FIG. 6 is a plan view illustrating a semiconductor device 12 according to some example embodiments.

Referring to FIG. 6, the semiconductor device 12 may include a semiconductor substrate 100, integrated circuits, first signal bumps 201S, second signal bumps 202S, first dummy bumps 201D, second dummy bumps 202D, and voltage bumps 200PG. In a plan view, the semiconductor substrate 100 may include a first signal region SR1, second signal regions SR2, a first dummy region DR1, a plurality of second dummy regions DR2, voltage supply regions PGR, and a plurality of passage regions PR.

In a plan view, each of the plurality of passage regions PR of the semiconductor substrate 100 may extend from the second side surface 102 of the semiconductor substrate 100 to the first signal region SR1. Each of the passage regions PR of the semiconductor substrate 100 may be located between the second dummy regions DR2 and between the voltage bump groups 200G. The passage width A may be at least three times of the second dummy pitch P2 in the first direction D1.

The semiconductor device 12 may further include at least one of the lower connection pads 110C, the lower dummy pads 110D, the upper connection pads 120C, the upper dummy pads 120D, the wiring patterns 130, and the through-vias 170, which are described above in the examples of FIGS. 1B to 1D.

Figure 7A:
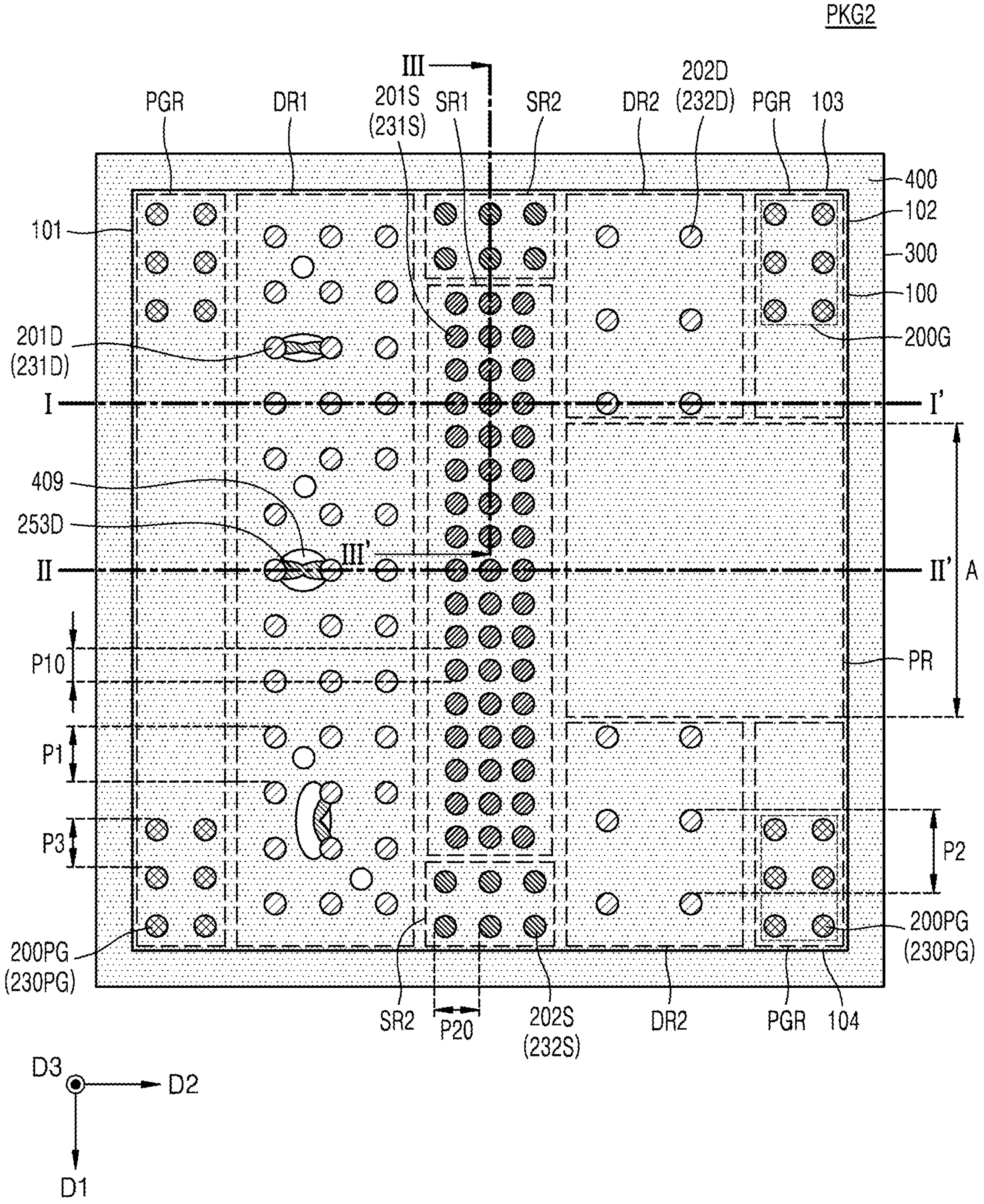
FIG. 7A is a plan view of a semiconductor package according to some example embodiments.
Figure 7B:
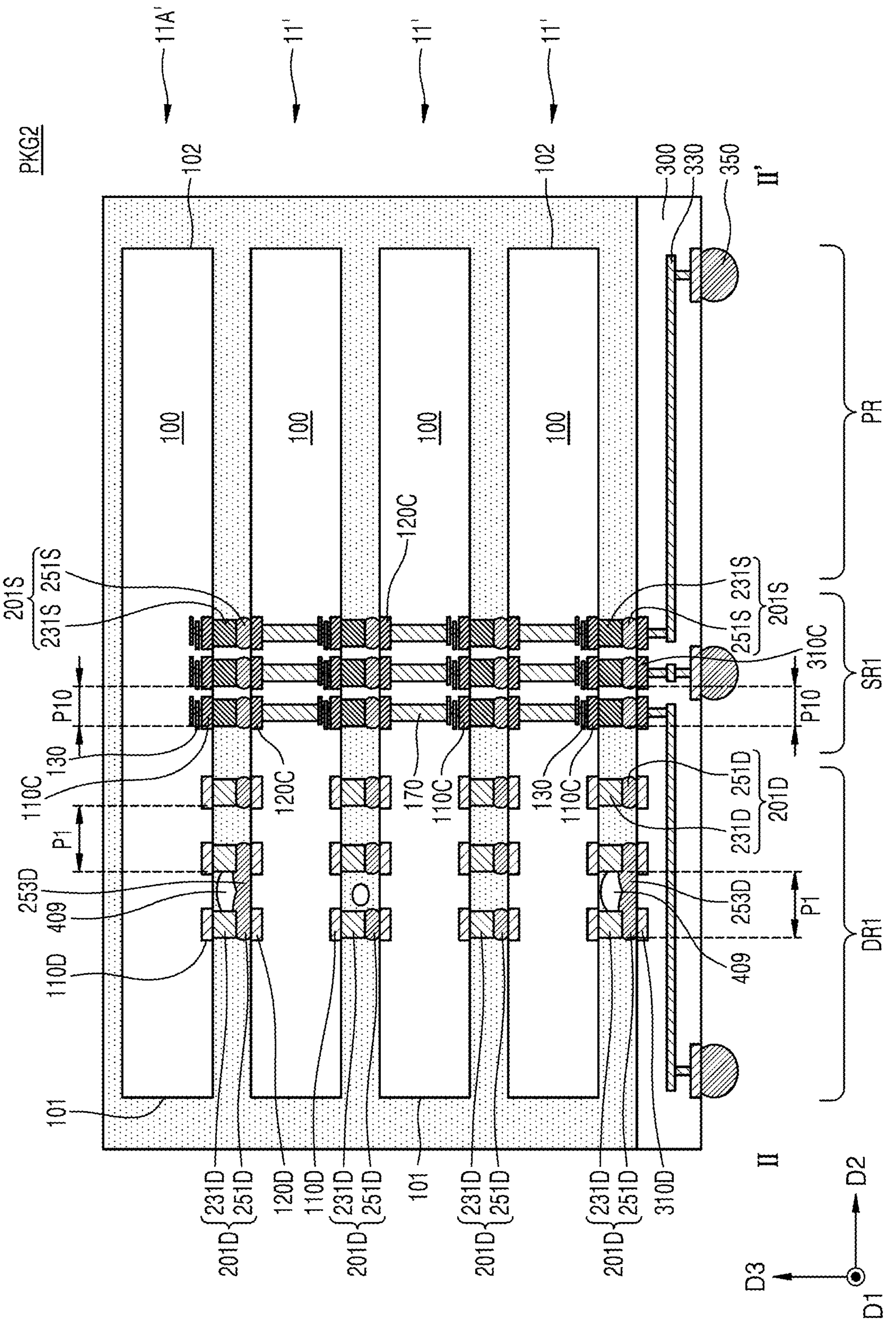
FIG. 7B is a cross-section of the semiconductor package taken along line II-II' of FIG. 7A.

FIG. 7A is a plan view of a semiconductor package PKG2 according to some example embodiments. FIG. 7B is a cross-section of the semiconductor package PKG2 taken along line II-II' of FIG. 7A. When describing FIGS. 7A and 7B, FIGS. 3B and 3D are referred to together. A cross-section taken along line I-I' of FIG. 7A may be substantially the same as FIG. 3B. A cross-section taken along line III-III' of FIG. 7A may be substantially the same as FIG. 3D. Hereinafter, repeated descriptions as those given above are omitted.

Referring to FIGS. 7A and 7B, the semiconductor package PKG2 may include a package substrate 300, solder ball terminals 350, first semiconductor chips 11F, a second semiconductor chip 11A', and a molding film 400. Each of the first semiconductor chips 11F may be substantially the same as the semiconductor device 11 described above in the examples of FIGS. 5A and 5B. For example, the semiconductor device 11 described above in the examples of FIGS. 5A and 5B may be stacked on the package substrate 300 to thereby form one of the first semiconductor chips 11'. The semiconductor device 11 may be repeatedly stacked thereon, and thus, a plurality of first semiconductor chips 11F may be provided. The connection relationship between a lowermost first semiconductor chip 11F and the package substrate 300 and the connection relationship between the first semiconductor chips 11F may be the same as or similar to those described above in the examples of the first semiconductor chips 10' and the package substrate 300 in FIGS. 3A to 3D and FIGS. 4A and 4B. Each of the first semiconductor chips 11' may include a semiconductor substrate 100, integrated circuits, wiring patterns 130, lower connection pads 110C, lower dummy pads 110D, upper connection pads 120C, upper dummy pads 120D, through-vias 170, first signal bumps 201S, second signal bumps 202S, first dummy bumps 201D, second dummy bumps 202D, and voltage bumps 200PG.

The second semiconductor chip 11A' may be disposed on an uppermost first semiconductor chip 11'. A second upper semiconductor chip may be substantially the same as the semiconductor device 11 described above in the examples of FIGS. 5A and 5B. However, the second semiconductor chip 11A' may include a semiconductor substrate 100, integrated circuits, wiring patterns 130, lower connection pads 110C, lower dummy pads 110D, first signal bumps 201S, second signal bumps 202S, first dummy bumps 201D, second dummy bumps 202D, and voltage bumps 200PG, but may not include upper connection pads 120C, upper dummy pads 120D, and through-vias 170. The thickness of the second semiconductor chip 11A' may be greater than the thickness of each of the first semiconductor chips 11'.

The molding film 400 may be disposed above the package substrate 300 and cover the first semiconductor chips 11' and the second semiconductor chip 11A'. For example, the molding film 400 may cover the first to fourth side surfaces 101, 102, 103, and 104 of the semiconductor substrate 100 of each of the first and second semiconductor chips 11F and 11A'. The molding film 400 may extend into a first gap region between the package substrate 300 and the lowermost first semiconductor chip 11', second gap regions between the first semiconductor chips 11', and a third gap region between the uppermost first semiconductor chip 11F and the second semiconductor chip 11A'. The molding film 400 may have a void 409 therein. The void 409 may be substantially the same as that described above in the examples of FIGS. 3A to 3D.

The semiconductor package PKG2 may include a dummy agglomerate solder 253D. The dummy agglomerate solder 253D may be located in the first gap region, the second gap regions, or the third gap region. Both end portions of the dummy agglomerate solder 253D may be disposed on lower surfaces of adjacent first dummy pillars 231D among the first dummy pillars 231D. When the dummy agglomerate solder 253D is located between the first semiconductor chips 11' or between the uppermost first semiconductor chip 11' and the second semiconductor chip 11A', both ends of the dummy agglomerate solder 253D may be disposed on upper surfaces of adjacent upper dummy pads 120D. When the dummy agglomerate solder 253D is formed between the package substrate 300 and the lowermost second semiconductor chip 11A', both end portions of the dummy agglomerate solder 253D may be disposed on upper surfaces of adjacent dummy substrate pads 310D. The middle portion of the dummy agglomerate solder 253D may be exposed to the void 409.

The void 409 may not be provided in the first and second signal regions SR1 and SR2, the voltage supply regions PGR, and the second dummy region DR2 of the semiconductor substrate 100.

The forming of the molding film 400 may include forming a preliminary molding film 400P in a liquid state and cooling the preliminary molding film 400P so as to form the molding film 400 in a solid state, which is described below in FIG. 7C. Hereinafter, a formation process of the molding film 400 is described below.

Figure 7C:
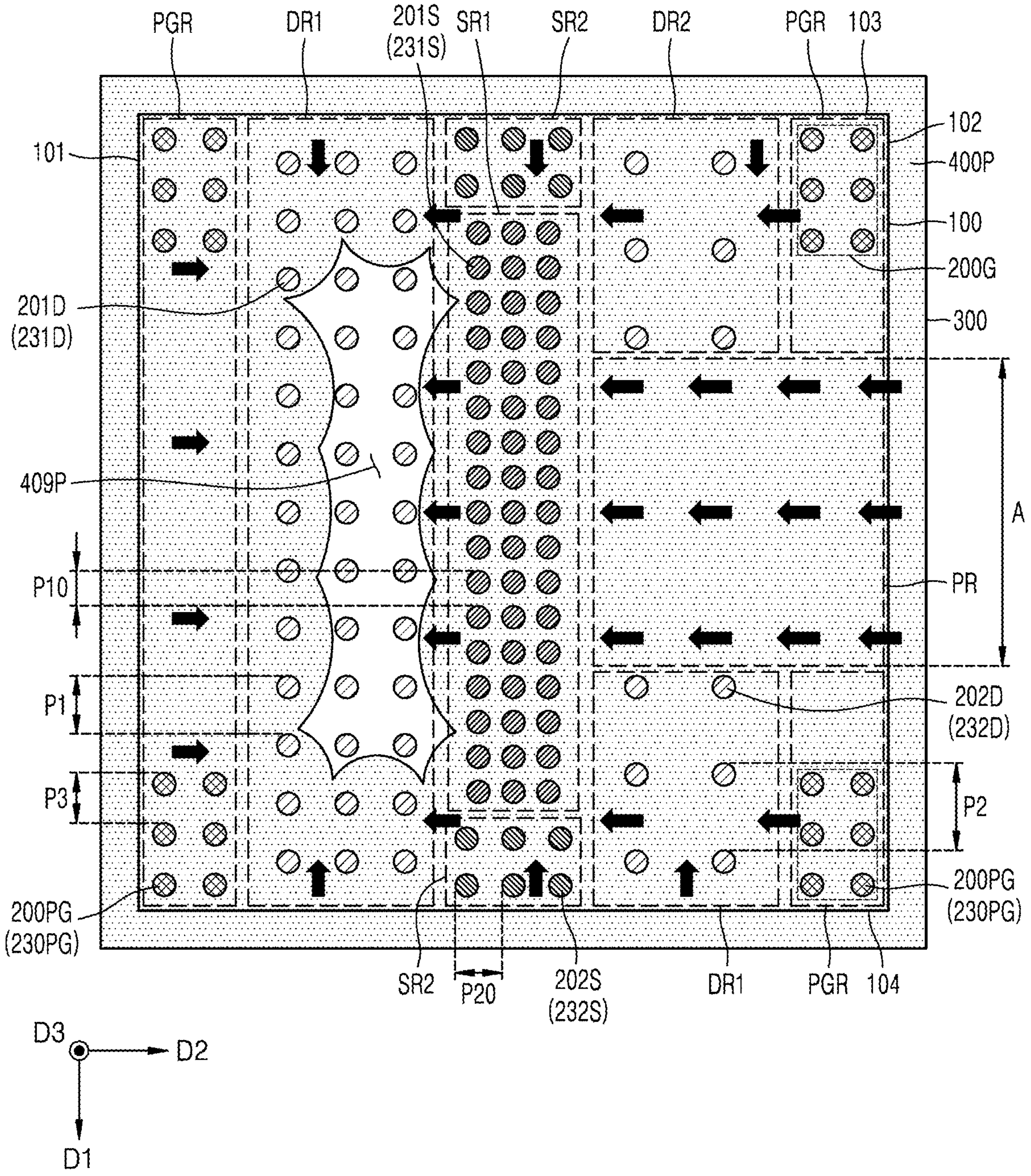
FIG. 7C is a plan view illustrating a process of forming a molding film in the semiconductor package of FIGS. 7A and 7B.

FIG. 7C is a plan view illustrating a process of forming the molding film 400 in the semiconductor package PKG2 of FIGS. 7A and 7B.

Referring to FIG. 7C, a preliminary molding film 400P may be formed and cover the upper surface of the package substrate 300, the first semiconductor chips 11', and the second semiconductor chip 11A'. As indicated by arrows in FIG. 7C, the preliminary molding film 400P may flow from the first to fourth side surfaces 101, 102, 103, and 104 of the semiconductor substrate 100 onto the lower surface of the semiconductor substrate 100.

A bump is not provided in the passage region PR of the semiconductor substrate 100, and thus, the preliminary molding film 400P may move very quickly and smoothly in the passage region PR. For example, the passage region PR on the semiconductor substrate 100 may be without any bumps, such as first signal bumps 201S, second signal bumps 202S, first dummy bumps 201D, second dummy bumps 202D, or voltage bumps 200PG, on the semiconductor substrate 100 in the passage region PR. For example, the moving speed of the preliminary molding film 400P in the passage region PR of the semiconductor substrate 100 may be greater than the moving speed of the preliminary molding film 400P in the first dummy region DR1 of the semiconductor substrate 100. As described above, the moving speed of the preliminary molding film 400P in the second dummy region DR2 of the semiconductor substrate 100 may be greater than the moving speed of the preliminary molding film 400P in the first dummy region DR1. Accordingly, the moving speed of the second portion of the preliminary molding film 400P flowing from the second side surface 102 of the semiconductor substrate 100 toward the first signal region SR1 via the passage region PR or the second dummy regions DR2 may be greater than the moving speed of the first portion of the preliminary molding film 400P flowing from the first side surface 101 of the semiconductor substrate 100 toward the first signal region SR1. When the preliminary molding film 400P completely fills spaces between the first signal bumps 201S, the preliminary molding film 400P may not fill at least a portion of the first dummy region DR1 of the semiconductor substrate 100. Accordingly, the void 409 of the preliminary molding film 400P may be formed in the first dummy region DR1. As the flow of the preliminary molding film 400P continues, the volume of the void 409 may be reduced.

According some example embodiments, the passage width A may be at least three times of the second dummy pitch P2 in the first direction D1, and thus, the preliminary molding film 400P may fill the first signal region SR1 of the semiconductor substrate 100 sufficiently quickly. The passage width A may be at least three times of the second dummy pitch P2 in the first direction D1, and thus, the void 409 of FIGS. 7A and 7B may be formed in the first dummy region DR1 of the semiconductor substrate 100, but may not be formed in the first signal region SR1 and the second signal region SR2.

Unlike the configuration of FIGS. 7A to 7C, when the passage region PR of the semiconductor substrate 100 is formed in the first dummy region DR1 or between the first side surface 101 of the semiconductor substrate 100 and the first signal region SR1, the moving speed of the second portion of the preliminary molding film 400P flowing from the second side surface 102 of the semiconductor substrate 100 toward the first signal region SR1 may be similar to the moving speed of the first portion of the preliminary molding film 400P flowing from the first side surface 101 of the semiconductor substrate 100 toward the first signal region SR1. In this case, a preliminary void 409P may be formed in the first signal region SR1 of the semiconductor substrate 100.

According to some example embodiments, the passage region PR of the semiconductor substrate 100 may be provided between the second dummy regions DR2, and thus, the moving speed of the second portion of the preliminary molding film 400P flowing from the second side surface 102 of the semiconductor substrate 100 toward the first signal region SR1 may be much greater than the moving speed of the first portion of the preliminary molding film 400P flowing from the first side surface 101 of the semiconductor substrate 100 toward the first signal region SR1. Accordingly, the preliminary void 409P may be further prevented or reduced in likelihood from being formed in the first signal region SR1 of the semiconductor substrate 100. The preliminary void 409P may be guided so as to be formed in the first dummy region DR1 of the semiconductor substrate 100.

The preliminary molding film 400P may flow from the third side surface 103 and the fourth side surface 104 of the semiconductor substrate 100 to the first signal region SR1, via the second signal regions SR2 of the semiconductor substrate 100. The second signal pitch P20 may be greater than the first signal pitch P10, and thus, the preliminary molding film 400P may flow more quickly and easily into the first signal region SR1 via the second signal regions SR2.

Referring back to FIGS. 7A and 7B together with FIG. 7C, the preliminary molding film 400P may be solidified by a cooling process to form the molding film 400. A remaining preliminary void 409P may form the void 409 in the molding film 400. The void 409 may be formed between adjacent first dummy pillars 231D. The sidewalls of the first dummy solder patterns 251D on the lower surfaces of the adjacent first dummy pillars 231D may be exposed to the void 409. The first dummy solder patterns 251D melted during a reflow process of the first dummy solder patterns 251D may flow into the void 409 and be connected to each other. Accordingly, a dummy agglomerate solder 253D may be formed. The manufacturing of the semiconductor package PKG2 may be completed by the manufacturing example embodiments described above.

Figure 8A:
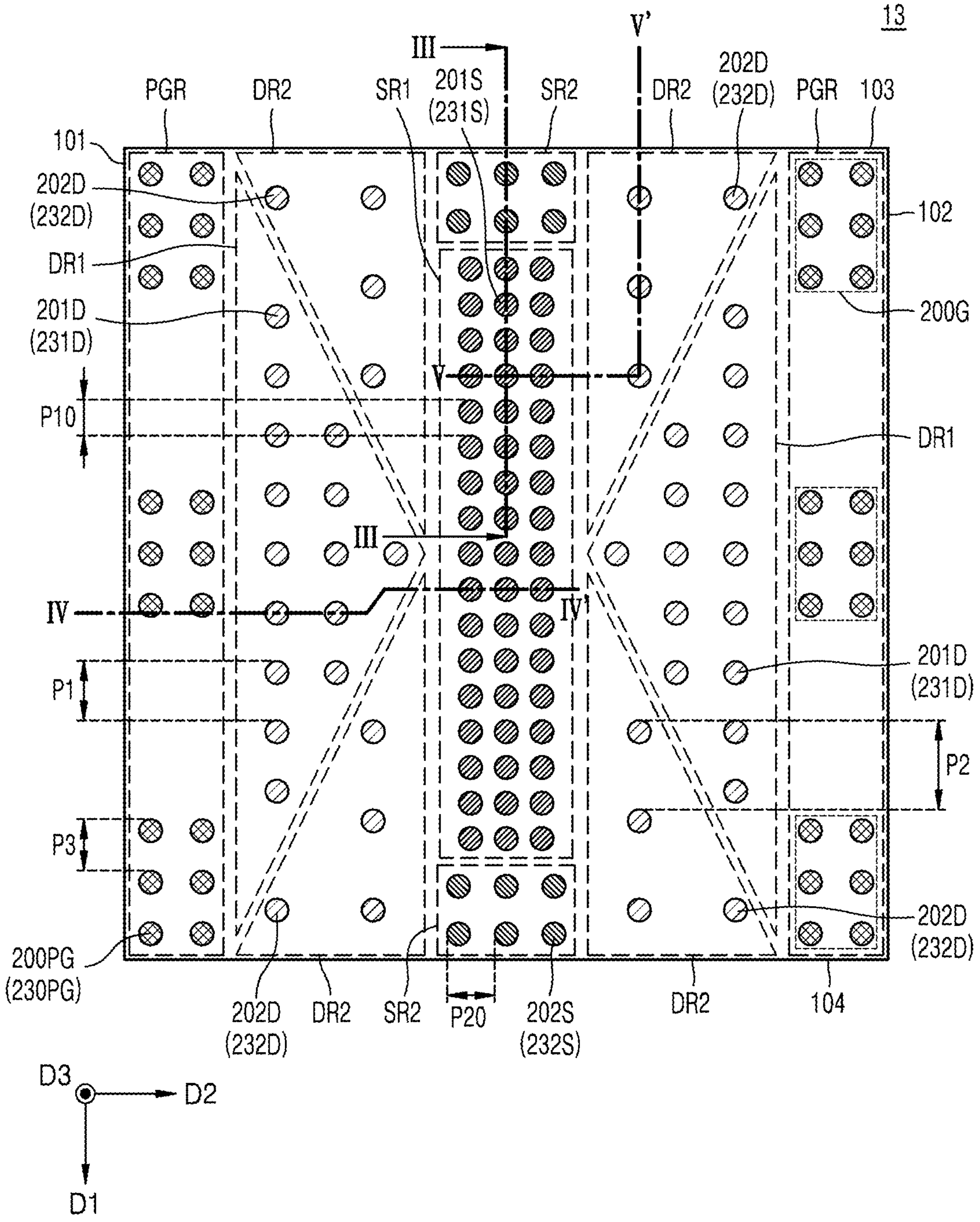
FIG. 8A is a plan view showing a semiconductor device according to some example embodiments.
Figure 8B:
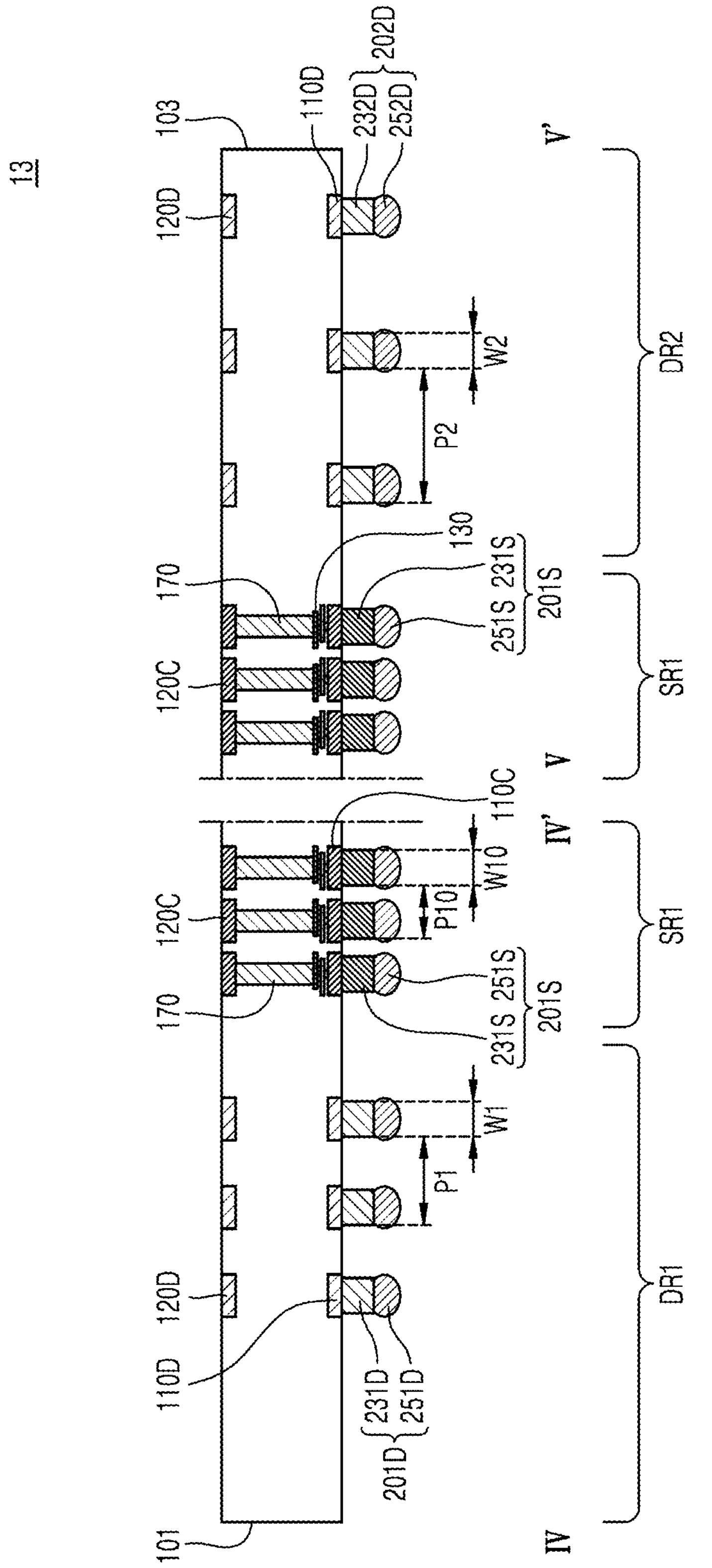
FIG. 8B shows a cross-section of the semiconductor device taken along line IV-IV' of FIG. 8A and a cross-section of the semiconductor device taken along line V-V' of FIG. 8A.

FIG. 8A is a plan view showing a semiconductor device 13 according to some example embodiments. FIG. 8B shows a cross-section of the semiconductor device 13 taken along line IV-IV' of FIG. 8A and a cross-section of the semiconductor device 13 taken along line V-V' of FIG. 8A. When describing FIGS. 8A and 8B, FIG. 1D may also be referenced. A cross-section taken along line III-III' of FIG. 8A may be substantially the same as FIG. 1D.

Referring to FIGS. 8A and 8B, the semiconductor device 13 may include a semiconductor substrate 100, integrated circuits, wiring patterns 130, lower connection pads 110C, lower dummy pads 110D, first signal bumps 201S, second signal bumps 202S, first dummy bumps 201D, second dummy bumps 202D, and voltage bumps 200PG. The semiconductor device 13 may further include upper connection pads 120C, upper dummy pads 120D, and through-vias 170.

In a plan view, the semiconductor substrate 100 may include a first signal region SR1, second signal regions SR2, a plurality of first dummy regions DR1, a plurality of second dummy regions DR2, and voltage supply regions PGR. The first signal region SR1, the second signal region SR2, and the voltage supply regions PGR of the semiconductor substrate 100 may be the same as or similar to those described above in the examples of FIGS. 1A to 1D.

The first dummy regions DR1 of the semiconductor substrate 100 may be provided on both sides of the first signal region SR1 in a plan view. For example, one of the first dummy regions DR1 of the semiconductor substrate 100 may be provided between the first signal region SR1 and the first side surface 101 of the semiconductor substrate 100 and another one of the first dummy regions DR1 of the semiconductor substrate 100 may be provided between the first signal region SR1 and the second side surface 102 of the semiconductor substrate 100. Each of the first dummy regions DR1 of the semiconductor substrate 100 may have a triangular or trapezoidal shape, but the example embodiments are not limited thereto. The first dummy bumps 201D may be arranged in the first dummy regions DR1 so as to form first dummy rows. In each of the first dummy regions DR1, the number of first dummy bumps 201D forming a first dummy row closest to the first signal region SR1 may be less than the number of first dummy bumps 201D forming a first dummy row closest to the corresponding voltage supply region PGR. The first dummy bumps 201D have a first dummy pitch P1, and the first dummy pitch P1 is the same as that described above in the examples of FIGS. 1A to 1D.

The second dummy regions DR2 of the semiconductor substrate 100 may be located adjacent to either the third side surface 103 or the fourth side surface 104 of the semiconductor substrate 100 in a plan view. For example, the first dummy regions DR1 of the semiconductor substrate 100 may be arranged between the second dummy regions DR2 and the first and second side surfaces 101 and 102 of the semiconductor substrate 100.

The second dummy regions DR2 of the semiconductor substrate 100 may be provided between the second signal region SR2 and the first dummy regions DR1 and extend between the first signal region SR1 and the first dummy regions DR1. For example, the first signal region SR1 and the second signal region SR2 may be arranged between the second dummy regions DR2 of the semiconductor substrate 100. The second dummy regions DR2 of the semiconductor substrate 100 may be spaced apart from each other in the second direction D2 with the first signal region SR1 therebetween. The second dummy regions DR2 of the semiconductor substrate 100 may be spaced apart from each other in the second direction D2 with the second signal region SR2 therebetween.

The second dummy regions DR2 of the semiconductor substrate 100 may be spaced apart from each other in the first direction D1 with the first dummy regions DR1 therebetween. In the first direction D1, the first dummy regions DR1 of the semiconductor substrate 100 may be arranged between the second dummy regions DR2.

The second dummy bumps 202D may be arranged in the second dummy regions DR2 so as to form second dummy rows. The length, in the first direction D1, of the second dummy row closest to the first signal region SR1 in any one of the second dummy regions DR2 may be greater than the length, in the first direction D1, of the first dummy row closest to the first signal region SR1 in any one of the first dummy regions DR1. Any one of the first dummy regions DR1 may be adjacent to the any one of the second dummy regions DR2 in the first direction D1 or in a direction opposite to the first direction D1. The second dummy pitch P2 may be greater than the first signal pitch P10, the second signal pitch P20, and the first dummy pitch P1.

Figure 9A:
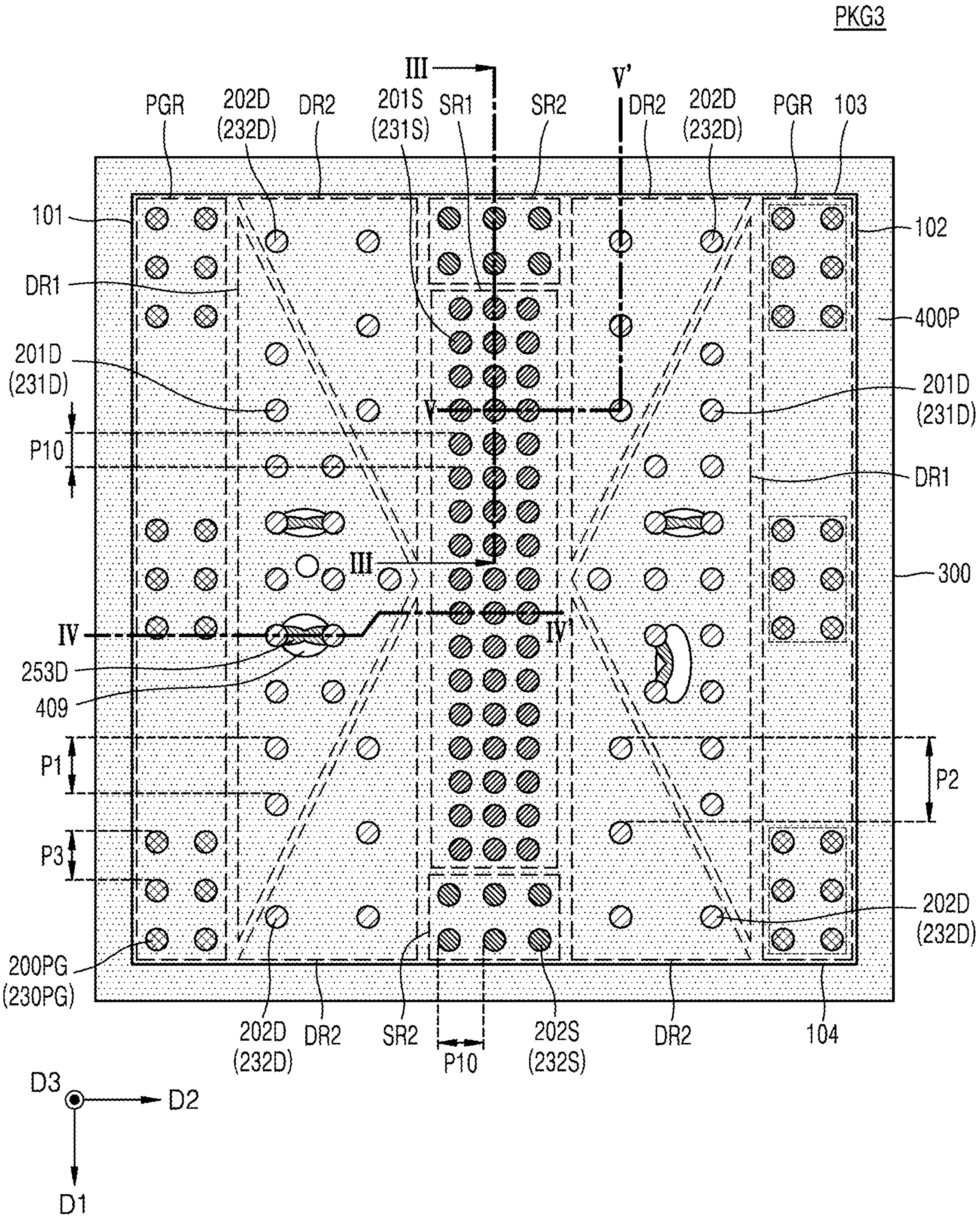
FIG. 9A is a plan view illustrating a semiconductor package according to some example embodiments.
Figure 9B:
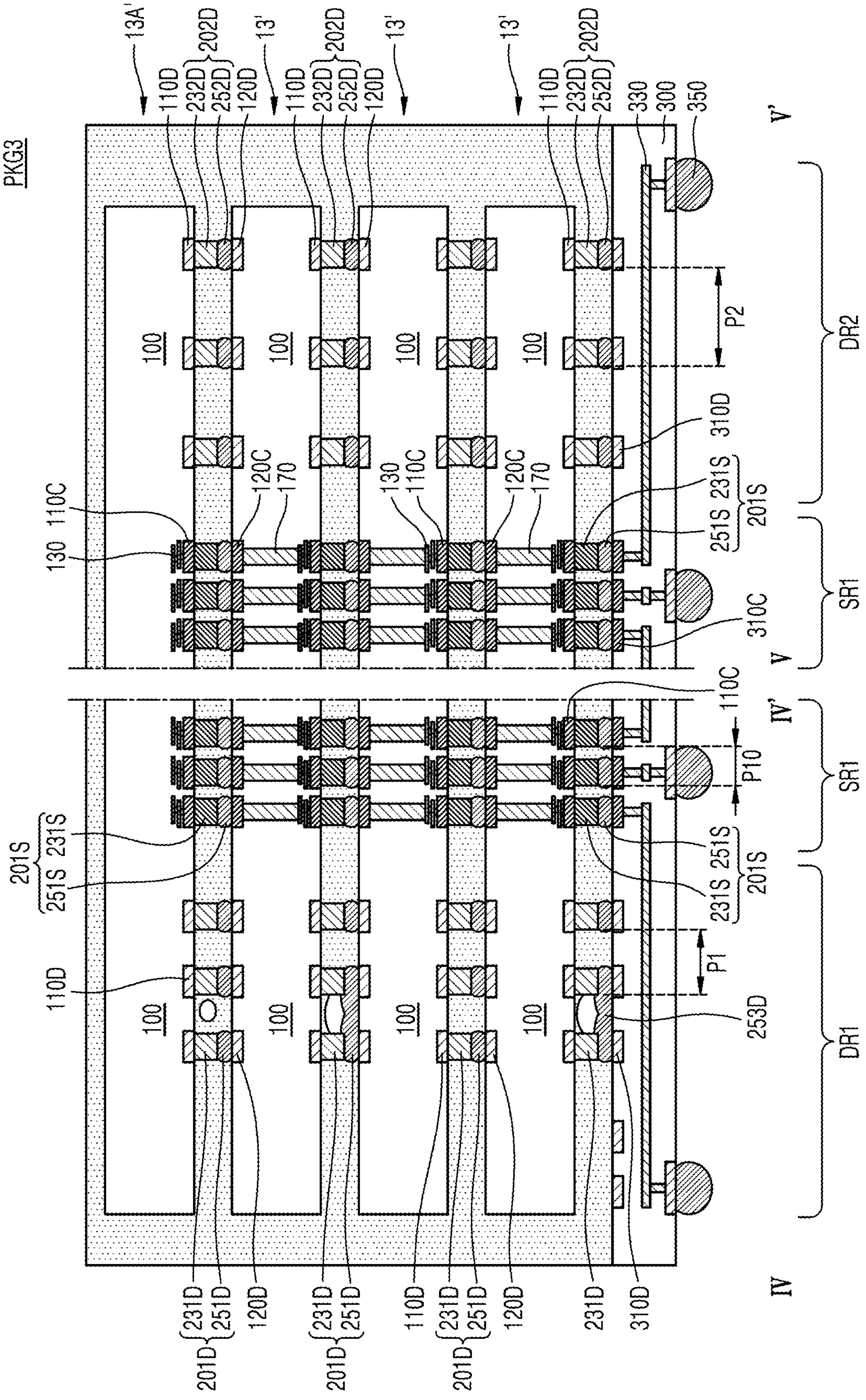
FIG. 9B shows a cross-section of the semiconductor package taken along line IV-IV' of FIG. 9A and a cross-section of the semiconductor package taken along line V-V' of FIG. 9A.
Figure 9C:
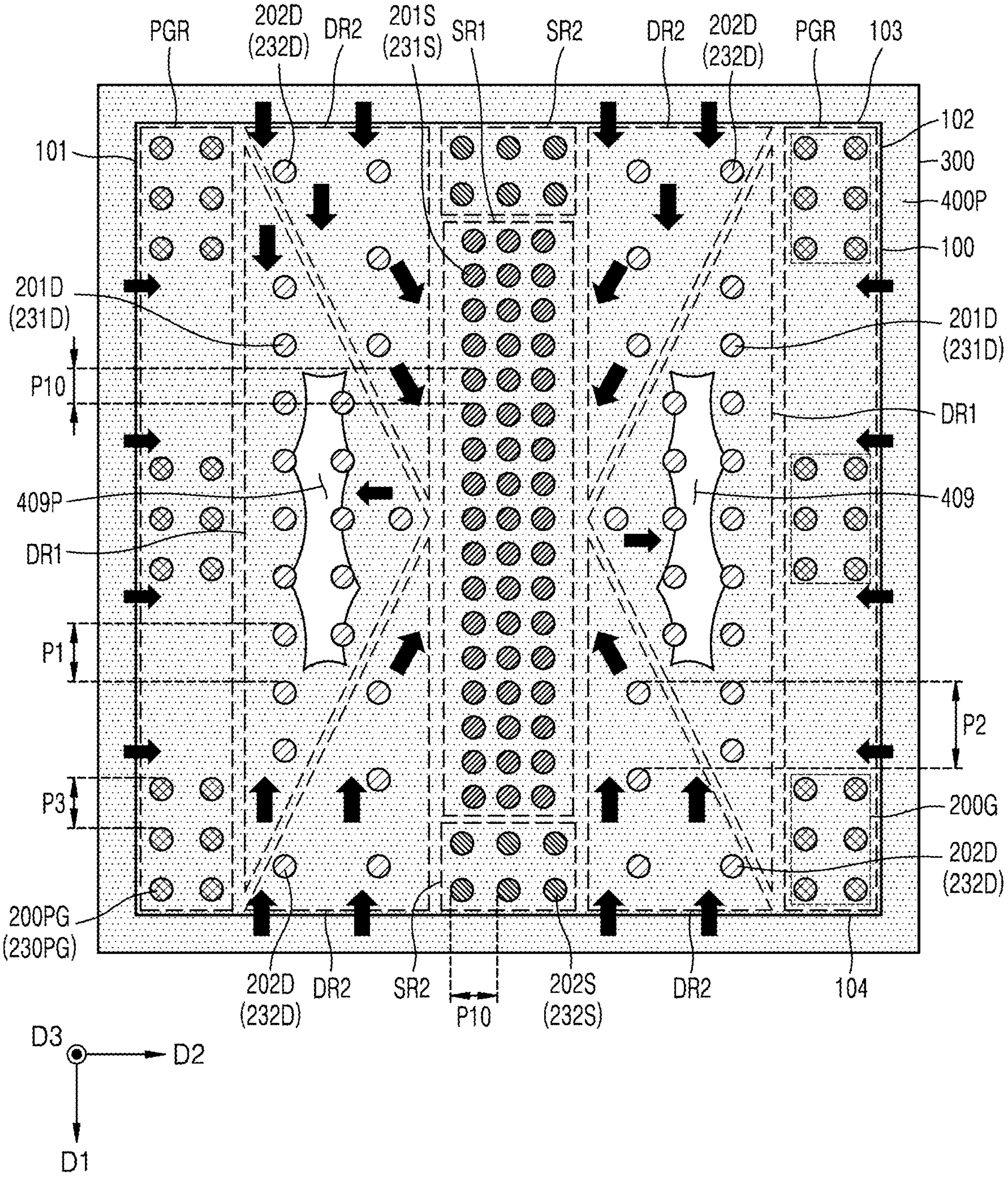
FIG. 9C is a plan view illustrating a process of forming a molding film in the semiconductor package of FIGS. 9A and 9B.

FIG. 9A is a plan view illustrating a semiconductor package PKG3 according to some example embodiments. FIG. 9B shows a cross-section of the semiconductor package PKG3 taken along line IV-IV' of FIG. 9A and a cross-section of the semiconductor package PKG3 taken along line V-V' of FIG. 9A. FIG. 9C is a plan view illustrating a process of forming a molding film in the semiconductor package PKG3 of FIGS. 9A and 9B. When describing FIGS. 9A and 9B, FIG. 3D is referred to together. A cross-section taken along line III-III' of FIG. 9A may be substantially the same as FIG. 3D.

Referring to FIGS. 9A and 9B, the semiconductor package PKG3 may include a package substrate 300, solder ball terminals 350, first semiconductor chips 13', a second semiconductor chip 13A', and a molding film 400. Each of the first semiconductor chips 13' may be substantially the same as the semiconductor device 13 described above in the examples of FIGS. 8A and 8B. The connection relationship between a lowermost first semiconductor chip 13' and the package substrate 300 and the connection relationship between the first semiconductor chips 13' may be the same as or similar to those described above in the examples of the first semiconductor chips 10' and the package substrate 300 in FIGS. 3A to 3D and FIGS. 4A and 4B. Each of the first semiconductor chips 13' may include a semiconductor substrate 100, integrated circuits, wiring patterns 130, lower connection pads 110C, lower dummy pads 110D, upper connection pads 120C, upper dummy pads 120D, through-vias 170, first signal bumps 201S, second signal bumps 202S, first dummy bumps 201D, second dummy bumps 202D, and voltage bumps 200PG.

The second semiconductor chip 13A' may be disposed on an uppermost first semiconductor chip 13'. A second upper semiconductor chip may be substantially the same as the semiconductor device 13 described above in the examples of FIGS. 8A and 8B. However, the second semiconductor chip 13A' may include a semiconductor substrate 100, integrated circuits, wiring patterns 130, lower connection pads 110C, lower dummy pads 110D, first signal bumps 201S, second signal bumps 202S, first dummy bumps 201D, second dummy bumps 202D, and voltage bumps 200PG, but may not include upper connection pads 120C, upper dummy pads 120D, and through-vias 170. The thickness of the second semiconductor chip 13A' may be greater than the thickness of each of the first semiconductor chips 13'.

The molding film 400 may be disposed above the package substrate 300 and cover the first semiconductor chips 13' and the second semiconductor chip 13A'. The molding film 400 may extend into a first gap region between the package substrate 300 and the lowermost first semiconductor chip 13', second gap regions between the first semiconductor chips 13', and a third gap region between the uppermost first semiconductor chip 13' and the second semiconductor chip 13A'.

The molding film 400 may have a void 409 on the lower surface of the first dummy regions DR1. The semiconductor package PKG3 may further include a dummy agglomerate solder 253D on the lower surface of the first dummy regions DR1 of the semiconductor substrate 100. The void 409 and the dummy agglomerate solder 253D may be substantially the same as described above in the examples of FIGS. 3A to 3D and FIGS. 7A to 7C.

The forming of the molding film 400 may include forming a preliminary molding film 400P in a liquid state and cooling the preliminary molding film 400P so as to form the molding film 400 in a solid state, as described below in FIG. 9C.

Referring to FIG. 9C together with FIGS. 9A and 9B, as indicated by arrows, the preliminary molding film 400P may flow, onto the lower surface of the semiconductor substrate 100, from the first to fourth side surfaces 101, 102, 103, and 104 of the semiconductor substrate 100 of each of the first semiconductor chips 13' and the second semiconductor chip 13A'. For example, the first portion of the preliminary molding film 400P may flow from the first side surface 101 of the semiconductor substrate 100 into the first dummy region DR1 corresponding thereto. The second portion of the preliminary molding film 400P may flow from the second side surface 102 of the semiconductor substrate 100 into the first dummy region DR1 corresponding thereto. The third portions of the preliminary molding film 400P may flow from the third side surface 103 and the fourth side surface 104 of the semiconductor substrate 100 into the second dummy regions DR2 and the second signal regions SR2 of the semiconductor substrate 100. The second dummy pitch P2 may be greater than the first dummy pitch P1, and thus, the moving speed of the preliminary molding film 400P in the second dummy regions DR2 of the semiconductor substrate 100 may be greater than the moving speed of the preliminary molding film 400P in the first dummy regions DR1. The third portions of the preliminary molding film 400P may quickly pass through the second dummy regions DR2 of the semiconductor substrate 100. The first signal region SR1 of the semiconductor substrate 100 may be located between the second dummy regions DR2, and thus, the third portions of the preliminary molding film 400P may quickly and smoothly flow into the first signal region SR1 of the semiconductor substrate 100. When the third portions of the preliminary molding film 400P move to the first dummy region DR1 after filling the space between the first signal bumps 201S, the first portion and the second portion of the preliminary molding film 400P may not fill at least a portion of the first dummy region DR1 of the semiconductor substrate 100. Accordingly, the preliminary void 409P of the preliminary molding film 400P may be formed in the first dummy regions DR1. The preliminary void 409P may not be formed in the first signal region SR1, the second signal region SR2, and the second dummy region DR2.

According to some example embodiments, the second dummy regions DR2 of the semiconductor substrate 100 may function as a passage through which the preliminary molding film 400P flows into the first signal region SR1. The length, in the first direction D1, of the second dummy row closest to the first signal region SR1 in each of the second dummy regions DR2 may be greater than the length, in the first direction D1, of the first dummy row closest to the first signal region SR1 in each of the first dummy regions DR1. Accordingly, the preliminary molding film 400P may be guided so as to flow into the first signal region SR1 via the second dummy regions DR2. The preliminary void 409P may be further prevented or reduced in likelihood from being formed between the first signal bumps 201S. The first dummy regions DR1 of the semiconductor substrate 100 may function as a passage through which the preliminary molding film 400P is discharged from the first signal region SR1.

Referring back to FIGS. 9A to 9C, the preliminary molding film 400P may be solidified by a cooling process to form the molding film 400. The preliminary void 409P remaining in the preliminary molding film 400P may form the void 409 in the molding film 400. A dummy agglomerate solder 253D may be formed on the lower surfaces of the first dummy regions DR1 of the semiconductor substrate 100. The void 409 and the dummy agglomerate solder 253D are the same as those described above. The manufacturing of the semiconductor package PKG3 may be completed by the manufacturing examples described above.

According to some example embodiments, the void 409 may not be provided in the first signal region SR1, the second signal regions SR2, the voltage supply regions PGR, and the second dummy regions DR2 of the semiconductor substrate 100. The occurrence of electrical short circuits between the first signal bumps 201S, the second signal bumps 202S, and voltage bumps 200PG may be prevented or reduced in likelihood. The semiconductor package PKG3 may exhibit improved electrical characteristics and reliability.

Figure 10:
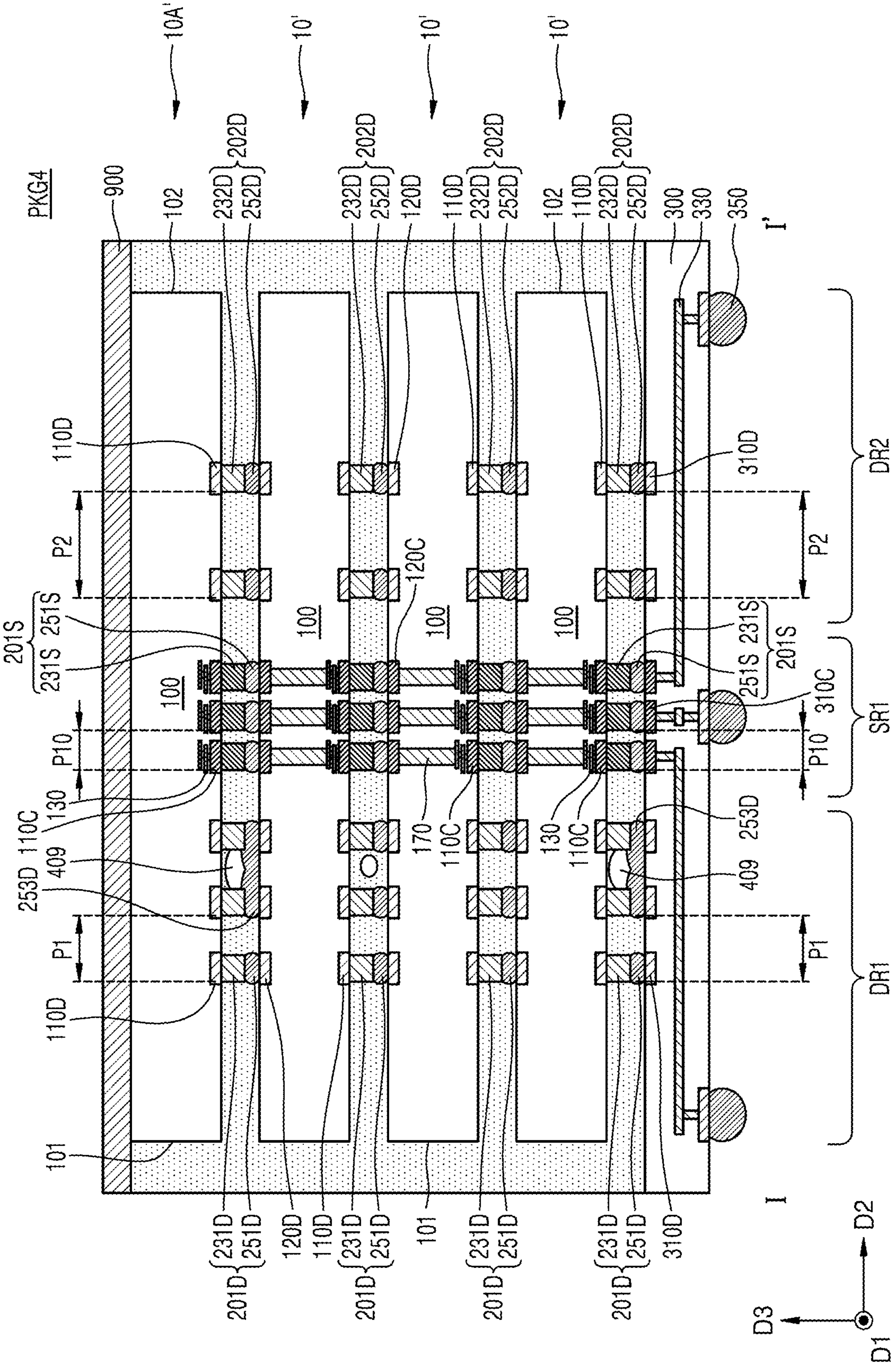
FIG. 10 is a cross-sectional view illustrating a semiconductor package according to some example embodiments.

FIG. 10 is a cross-sectional view illustrating a semiconductor package PKG4 according to some example embodiments and corresponds to a cross-section taken along line II-II' of FIG. 3A.

Referring to FIG. 10, the semiconductor package PKG4 may include a heat dissipation structure 900, in addition to the package substrate 300, the solder ball terminals 350, the first semiconductor chips 10', the second semiconductor chip 10A', and the molding film 400. The upper surface of the molding film 400 may cover the sidewalls of the first and second semiconductor chips 10' and 10A', but may not cover the upper surface of the second semiconductor chip 10A'. The heat dissipation structure 900 may be disposed on the upper surface of the second semiconductor chip 10A' and the upper surface of the molding film 400. The heat dissipation structure 900 may further extend onto the side surface of the molding film 400. The heat dissipation structure 900 may include a heat sink, a heat slug, or a thermal interface material layer. The heat dissipation structure 900 may include, for example, metal.

The example embodiments may be combined with each other. According to some example embodiments, at least two of the example embodiments among the semiconductor device 10 of FIGS. 1A to 1D, the semiconductor device 10A of FIGS. 2A to 2C, the semiconductor package PKG1 of FIGS. 3A to 3D, the semiconductor device 11 of FIGS. 5A and 5B, the semiconductor device 12 of FIG. 6, the semiconductor package PKG2 of FIGS. 7A and 7B, the semiconductor device 13 of FIGS. 8A and 8B, the semiconductor package PKG3 of FIGS. 9A and 9B, and the semiconductor package PKG4 of FIG. 10 may be combined with each other. For example, the semiconductor package PKG2 of FIGS. 7A and 7B or the semiconductor package PKG3 of FIGS. 9A and 9B may further include the heat dissipation structure 900 of FIG. 10. In another example, at least one of the first semiconductor chips 13' of the semiconductor package PKG3 of FIGS. 9A and 9B may be manufactured using the semiconductor device 10 of FIGS. 1A to 1D, the semiconductor device 11 of FIGS. 5A and 5B, or the semiconductor device 12 of FIG. 6. Combinations of example embodiments may be modified variously.

According to the inventive concepts, the semiconductor device may include the signal bumps, the first dummy bumps, and the second dummy bumps. The second dummy pitch of the second dummy bumps may be greater than the first dummy pitch of the first dummy bumps. As the second dummy bumps are provided, the void may be prevented or reduced in likelihood from being formed between the signal bumps during the formation of the molding film. Accordingly, the occurrence of electrical short circuits between the signal bumps may be prevented or reduced in likelihood. The void may be guided by the second dummy bumps so that the void is formed between the first dummy bumps. Accordingly, the dummy agglomerate solder may be formed on the lower surfaces of the first dummy pillars. The semiconductor package is manufactured using the semiconductor device described above and may thus exhibit improved reliability and electrical characteristics.

While the inventive concepts have been particularly shown and described with reference to example embodiments thereof, it will be understood that various changes in form and details may be made therein without departing from the spirit and scope of the following claims.

What is claimed is:

1. A semiconductor package comprising:

a package substrate;

a first semiconductor chip on the package substrate; and a molding film on the package substrate and covering a side surface of the first semiconductor chip, wherein the first semiconductor chip includes, a first semiconductor substrate, first signal pillars on a lower surface of a first signal region of the first semiconductor substrate and having a first signal pitch, first dummy pillars on a lower surface of a first dummy region of the first semiconductor substrate and having a first dummy pitch greater than the first signal pitch, second dummy pillars on a lower surface of a second dummy region of the first semiconductor substrate and having a second dummy pitch greater than the first dummy pitch, and a dummy agglomerate solder connected to lower surfaces of adjacent first dummy pillars among the first dummy pillars, wherein the molding film extends between the package substrate and the first semiconductor chip and covers sidewalls of the first signal pillars and sidewalls of the second dummy pillars, and a first void defined by the molding film, the first void between the adjacent first dummy pillars, and at least a portion of the dummy agglomerate solder is provided in the first void.

2. The semiconductor package of claim 1, wherein the first signal region extends in a direction parallel to a first side surface and a direction parallel to a second side surface of the first semiconductor substrate in a plan view, and a third side surface of the first semiconductor substrate is adjacent to the first side surface, adjacent to the second side surface of the first semiconductor substrate, and shorter than the first side surface and the second side surface of the first semiconductor substrate.

3. The semiconductor package of claim 2, wherein the first dummy region of the first semiconductor substrate is between the first signal region and the first side surface of the first semiconductor substrate, and the second dummy region of the first semiconductor substrate is between the first signal region and the second side surface of the first semiconductor substrate.

4. The semiconductor package of claim 2, wherein the first dummy region of the first semiconductor substrate is between the first signal region and the first side surface of the first semiconductor substrate, and the second dummy region of the first semiconductor substrate is adjacent to the third side surface of the first semiconductor substrate and extends between the first signal region and the first dummy region of the first semiconductor substrate.

5. The semiconductor package of claim 2, wherein the first semiconductor chip further comprises:

second signal pillars on lower surfaces of second signal regions of the first semiconductor substrate and having a second signal pitch greater than the first signal pitch, and the second signal regions of the first semiconductor substrate are located between the first signal region and the third side surface of the first semiconductor substrate and the second signal regions are between the first signal region and a fourth side surface of the first semiconductor substrate, wherein the fourth side surface of the first semiconductor substrate is opposite to the third side surface of the first semiconductor substrate.

6. The semiconductor package of claim 5, wherein a pitch between the second signal pillars is less than the second dummy pitch.

7. The semiconductor package of claim 1, wherein the first semiconductor substrate further includes voltage bumps on a lower surface of a corner region of the first semiconductor substrate in a plan view, and a pitch between the voltage bumps is greater than the first signal pitch and less than the second dummy pitch.

8. The semiconductor package of claim 1, wherein the first semiconductor chip further includes through-vias passing through the first semiconductor chip, the first signal pillars are electrically connected to the through-vias, and the first dummy pillars and the second dummy pillars are electrically insulated from the through-vias.

9. The semiconductor package of claim 8, further comprising:

a second semiconductor chip on the first semiconductor chip, wherein the second semiconductor chip includes, a second semiconductor substrate, first upper signal pillars on a lower surface of an upper signal region of the second semiconductor substrate and having an upper signal pitch, first upper dummy pillars on a lower surface of a first upper dummy region of the second semiconductor substrate and having a first upper dummy pitch greater than the upper signal pitch, and second upper dummy pillars on a lower surface of a second upper dummy region of the second semiconductor substrate and having a second upper dummy pitch greater than the first upper dummy pitch, wherein the molding film extends between the first semiconductor chip and the second semiconductor chip and the molding film covers sidewalls of the first upper signal pillars and sidewalls of the second upper dummy pillars, and the molding film defines a second void between the first upper dummy pillars.

10. The semiconductor package of claim 1, wherein a width of each of the first signal pillars is equal to a width of each of the first dummy pillars and a width of each of the second dummy pillars.

11. A semiconductor device comprising:

a semiconductor substrate;

signal bumps on a signal region of the semiconductor substrate;

first dummy bumps on a first dummy region of the semiconductor substrate and having a first dummy pitch greater than a signal pitch of the signal bumps; and second dummy bumps on second dummy regions of the semiconductor substrate and having a second dummy pitch greater than the signal pitch of the signal bumps, wherein the second dummy pitch is different from the first dummy pitch, the signal region of the semiconductor substrate is spaced apart from a first side surface and a second side surface of the semiconductor substrate and the signal region extends in a first direction in a plan view, the first dummy region of the semiconductor substrate is between the signal region and the first side surface of the semiconductor substrate, the second dummy regions of the semiconductor substrate are between the signal region and the second side surface of the semiconductor substrate, and the second side surface of the semiconductor substrate is opposite to the first side surface of the semiconductor substrate, a passage region on the semiconductor substrate without any bumps on the semiconductor substrate in the passage region, the passage region of the semiconductor substrate extends from the second side surface of the semiconductor substrate to the signal region of the semiconductor substrate in a plan view, and a width of the passage region of the semiconductor substrate in the first direction is at least three times of the second dummy pitch.

12. The semiconductor device of claim 11, wherein the second dummy pitch is greater than the first dummy pitch, and the passage region is between the second dummy regions.

13. The semiconductor device of claim 12, wherein the passage region includes a plurality of passage regions, and each passage region of the plurality of passage regions is provided between at least two of the second dummy regions in a plan view.

14. The semiconductor device of claim 11, further comprising:

voltage bumps arranged a power supply region of the semiconductor substrate, wherein the power supply region of the semiconductor substrate is between the second dummy regions and the second side surface of the semiconductor substrate in a plan view, and the voltage bumps are not between the passage region of the semiconductor substrate and the second side surface of the semiconductor substrate.

15. The semiconductor device of claim 11, wherein the first side surface of the semiconductor substrate is parallel to the first direction, and the first side surface of the semiconductor substrate is adjacent to a third side surface of the semiconductor substrate and longer than the third side surface of the semiconductor substrate.

16. A semiconductor package comprising:

a package substrate including connection substrate pads and dummy substrate pads;

solder ball terminals on a lower surface of the package substrate, connected to the connection substrate pads, and insulated from the dummy substrate pads;

a first semiconductor chip on an upper surface of the package substrate;

a second semiconductor chip on an upper surface of the first semiconductor chip; and a molding film on the package substrate and covering a sidewall of the first semiconductor chip and a sidewall of the second semiconductor chip, wherein the first semiconductor chip includes, a first semiconductor substrate;

first through-vias passing through the first semiconductor substrate;

first upper connection pads on the first semiconductor substrate and connected to the first through-vias; and first upper dummy pads laterally spaced apart from the first upper connection pads and insulated from the first through-vias, wherein the second semiconductor chip includes,
a second semiconductor substrate;
first signal pillars on a lower surface of a first signal region of the second semiconductor substrate and having a first signal pitch;
second signal pillars on lower surfaces of second signal regions of the second semiconductor substrate and having a second signal pitch greater than the first signal pitch;
first dummy pillars on a lower surface of a first dummy region of the second semiconductor substrate and having a first dummy pitch greater than the first signal pitch and the second signal pitch;
second dummy pillars on a lower surface of a second dummy region of the second semiconductor substrate and having a second dummy pitch greater than the first signal pitch and the second signal pitch; and
voltage pillars on a lower surface of a corner region of the second semiconductor substrate and having a voltage pitch greater than the first signal pitch and the second signal pitch,
wherein the second dummy pitch is greater than the first dummy pitch,
the first signal region extends in a direction parallel to a first side surface and a second side surface of the second semiconductor substrate in a plan view, and the first side surface and the second side surface of the second semiconductor substrate are longer than a third side surface and a fourth side surface of the second semiconductor substrate,
the second signal regions are between the first signal region and the third side surface of the second semiconductor substrate and between the first signal region and the fourth side surface of the second semiconductor substrate,
the first signal pillars, the second signal pillars, and the voltage pillars are electrically connected to the first upper connection pads,
the first dummy pillars and the second dummy pillars are connected to the first upper dummy pads,
the molding film extends between the first semiconductor chip and the second semiconductor chip and covers sidewalls of the first signal pillars, sidewalls of the second signal pillars, sidewalls of the voltage pillars, and sidewalls of the second dummy pillars,
the second semiconductor chip includes a dummy agglomerate solder on lower surfaces of adjacent first dummy pillars among the first dummy pillars, and
the dummy agglomerate solder is on upper surfaces of at least two of the first upper dummy pads.

17. The semiconductor package of claim 16, wherein the molding film defines voids therein,
at least one of the voids is between the adjacent first dummy pillars, and
the voids are not between the first signal pillars and between the second signal pillars.

18. The semiconductor package of claim 17, wherein the dummy agglomerate solder includes,
end portions on the lower surfaces of the adjacent first dummy pillars, and
a middle portion between the end portions and exposed to the voids.

19. The semiconductor package of claim 16, wherein the first signal pitch is about 15 μm to about 45 μm, the second signal pitch is about 25 μm to about 55 μm, the voltage pitch is about 45 μm to about 65 μm, and the first dummy pitch is about 55 μm to about 80 μm.

20. The semiconductor package of claim 16, wherein the first dummy region of the second semiconductor substrate is between the first signal region and the second signal regions and the first side surface of the second semiconductor substrate,
the second dummy region of the second semiconductor substrate is between the first signal region and the second signal regions and the second side surface of the second semiconductor substrate,
the second semiconductor substrate further includes a passage region without a bump in the passage region,
the passage region of the second semiconductor substrate extends from the second side surface of the second semiconductor substrate to the first signal region of the second semiconductor substrate in a plan view, and
a width of the passage region of the second semiconductor substrate in a direction parallel to the first side surface of the second semiconductor substrate is at least three times of the second dummy pitch and less than or equal to ⅓ of a width of the first side surface of the second semiconductor substrate.

* * * * *